US011817827B2

(12) United States Patent
Salameh

(10) Patent No.: US 11,817,827 B2
(45) Date of Patent: Nov. 14, 2023

(54) POWER AMPLIFIER EQUALIZER

(71) Applicant: pSemi Corporation, San Diego, CA (US)

(72) Inventor: Daoud Salameh, Reading (GB)

(73) Assignee: pSemi Corporation

( * ) Notice: Subject to any disclaimer, the term of this patent is extended or adjusted under 35 U.S.C. 154(b) by 48 days.

(21) Appl. No.: 17/165,198

(22) Filed: Feb. 2, 2021

(65) Prior Publication Data

US 2022/0247358 A1 Aug. 4, 2022

(51) Int. Cl.
*H03F 1/02* (2006.01)
*H03F 1/32* (2006.01)
(Continued)

(52) U.S. Cl.
CPC ......... *H03F 1/0233* (2013.01); *H03F 1/3211* (2013.01); *H03F 3/213* (2013.01); *H03F 3/45264* (2013.01)

(58) Field of Classification Search
CPC ...... H03F 1/0233; H03F 1/3211; H03F 3/213; H03F 3/45264
(Continued)

(56) References Cited

U.S. PATENT DOCUMENTS 5,146,177 A * 9/1992 Katz ................. H03F 3/608
333/17.2
5,661,437 A * 8/1997 Nishikawa ............... H03F 1/34
330/282
(Continued)

FOREIGN PATENT DOCUMENTS

EP 1936799 6/2008
EP 3525341 8/2019
(Continued)

OTHER PUBLICATIONS

Salameh, Daoud, patent application filed Feb. 2, 2021 entitled "Power Amplifier Linearizer", U.S. Appl. No. 17/165,493, 33 pgs.
(Continued)

*Primary Examiner* — Andrea Lindgren Baltzell
*Assistant Examiner* — Khiem D Nguyen
(74) *Attorney, Agent, or Firm* — JAQUEZ LAND GREENHAUS & McFARLAND LLP; John Land, Esq.

(57) ABSTRACT

Circuits and methods for achieving good AM-AM and AM-PM metrics while achieving good power, PAE, linearity, and EVM performance in an amplifier. Embodiments provide an equalization approach which compensates for AM-AM and AM-PM variations in an amplifier by controlling bias voltage versus output power to alter the AM-AM and AM-PM profiles imposed by the amplifier. Differential amplifier embodiments include cross-coupled common-gate transistors that generate an equalization voltage that alters the gate bias voltage of respective main FETs in proportion to a power level present at the respective drains of the main FETs. Single-ended amplifier embodiments include an equalization circuit that alters the bias voltage to the gate of a main FET in proportion to a power level present at the main FET drain. Embodiments may also include a linearization circuit which alters the AM-PM profile of an input signal to compensate for the AM-PM profile imposed by a coupled amplifier.

20 Claims, 18 Drawing Sheets

(51) Int. Cl.
*H03F 3/213* (2006.01)
*H03F 3/45* (2006.01)

(58) Field of Classification Search
USPC .................................................. 330/252–261
See application file for complete search history.

(56) References Cited

U.S. PATENT DOCUMENTS

| | | | |
|---|---|---|---|
| 9,197,194 B2 | 11/2015 | Reedy et al. | |
| 2014/0300417 A1 | 10/2014 | Xu et al. | |
| 2015/0091668 A1 | 4/2015 | Solomko | |
| 2016/0020740 A1* | 1/2016 | Arcudia | H03F 1/42 330/261 |
| 2019/0158030 A1 | 5/2019 | Hou et al. | |
| 2019/0253025 A1* | 8/2019 | Deng | H03F 1/0227 |
| 2019/0280654 A1 | 9/2019 | Darwish | |
| 2022/0247361 A1 | 8/2022 | Salameh et al. | |

FOREIGN PATENT DOCUMENTS

| | | |
|---|---|---|
| KR | 1020040106018 | 12/2004 |
| KR | 100845661 | 7/2008 |
| WO | 2022169713 | 8/2022 |

OTHER PUBLICATIONS

Nguyen, Khiem D., Office Action received from the USPTO dated Jun. 8, 2022 for U.S. Appl. No. 17/165,493, 15 pgs.

Fedi, Giulio, International Search Report and Written Opinion receivd from the EPO dated May 2, 2022 for appln. No. PCT/US2022/014113, 17 pgs.

Rezaei, et al., "A Systematic Methodology to Design Analog Predistortion Linearizer for Dual Inflection Power Amplifiers", Microwave Symposium Digest (MTT), 2011 IEEE MTT-S International, IEEE, Jun. 5, 2011, pp. 1-4.

Zhou, et al. "A Millimeter-Wave Predistortion Linearizer for Traveling Wave Tube Amplifiers", 2012 International Conference on Microwave and Millimeter Wave Technology (ICMMT), IEEE, May 5, 2012, pp. 1-3.

Park, Hye Lyun, International Search Report and Written Opinion received from KIPO dated May 18, 2022 for appln. No. PCT/US2022/014594, 10 pgs.

Nguyen, Khiem, Notice of Allowance received from the USPTO dated Jan. 5, 2023 for U.S. Appl. No. 17/165,493, 18 pgs.

* cited by examiner

*1200*

```
Coupling an equalization circuit coupled to the
respective gates and drains of first and second
field-effect transistor (FETs) configured as a
differential amplifier, the first and second FETs
each including a gate configured to receive a
respective input signal, a drain providing a
respective amplified output signal, and a source
coupled to circuit ground
```
— 1202

```
Altering a bias voltage to the gates of the
respective first and second FETs in proportion
to a power level present at the respective
drains of the second and first FETs, as
determined by the equalization circuit
```
— 1204

```
┌─────────────────────────────────────────┐
│ Coupling an equalization circuit coupled to the │
│ gate and drain of a main field-effect transistor │
│ (FET) configured as an amplifier, the main FET  │──── 1302
│ including a gate configured to receive an input │
│ signal, a drain providing a amplified output    │
│ signal, and a source coupled to circuit ground  │
└─────────────────────────────────────────┘
                    │
                    ▼
┌─────────────────────────────────────────┐
│ Altering a bias voltage to the gate of the main │
│ FET in proportion to a power level present at   │──── 1304
│ the drain of the main FET, as determined by the │
│ equalization circuit                            │
└─────────────────────────────────────────┘
```

FIG. 13

POWER AMPLIFIER EQUALIZER

CROSS-REFERENCE TO RELATED APPLICATIONS

This invention may be related to the following patent application, assigned to the assignee of the present invention, the contents of which are incorporated by reference:

U.S. patent application Ser. No. 17/165,493, filed, Feb. 2, 2021 entitled "Power Amplifier Linearizer".

BACKGROUND

(1) Technical Field

This invention relates to electronic circuitry, and more particularly to electronic amplifier circuits.

(2) Background

Electronic amplifiers, including power amplifiers (PA) and low-noise amplifiers (LNAs), are used in a multitude of electronic systems, particularly radio frequency (RF) systems, such as radios, cellular telephones, WiFi, etc. In many applications, important design parameters for an amplifier, particularly a power amplifier, include amplitude-to-amplitude modulation (AM-AM) variation versus output power, amplitude-to-phase modulation (AM-PM) variation versus output power, power added efficiency (PAE), power, and linearity.

AM-AM conversion is a measure of non-linear distortion which happens due to undesired amplitude changes. More specifically, AM-AM distortion is the distortion of the magnitude of the gain characteristic as a function of input amplitude. The input amplitude modulates the gain and thus the output amplitude. An example of AM-AM distortion is an amplifier's compression characteristic, where high input signals cause the gain characteristic to depart from a linear response. The compression of the gain implies that the output amplitude increases by less than an associated increase in input amplitude. One can also observe gain expansion. This often occurs in Class AB amplifiers before the amp starts to compress.

AM-to-PM conversion is a measure of non-linear distortion of the amount of undesired phase deviation (PM) that is caused by amplitude variations (AM) of the system. AM-to-PM conversion is usually defined as the change in output phase for a 1-dB increment in a power-sweep applied to an amplifier's input (i.e., at the 1 dB gain compression point). An ideal amplifier would have no interaction between its phase response and the power level of the input signal, and thus have a flat conversion curve.

PAE is a metric for rating the efficiency of an amplifier, particularly a power amplifier, that takes into account the effect of the gain of the amplifier. More specifically, the PAE of an amplifier is the ratio of produced signal power (difference between output and input power) and the DC input power for the amplifier.

In power amplifiers in particular, AM-AM and AM-PM variation versus output power have a dominant effect on linearity and error vector magnitude (EVM) performance. In an amplifier based on field-effect transistors (FETs), AM-PM and AM-AM behavior is influenced by FET gate-source non-linear capacitance ($C_{GS}$). Degradation in linearity and EVM performance can be reduced by operating further away from the 1 dB compression point (P1 dB), which is the output power level at which the gain of the amplifier decreases 1 dB from its constant value (once an amplifier reaches its P1 dB point, it goes into compression and becomes a non-linear device, producing distortion, harmonics, and intermodulation products). However, operation far below P1 dB significantly degrades PAE performance.

In some integrated circuit (IC) FET fabrication technologies, good AM-AM and AM-PM metrics can only be achieved at high current density, but at the expense of high PAE and thermal performance. In other IC FET fabrication technologies, good power and PAE metrics can be achieved at low current density but AM-AM and AM-PM metrics vary significantly close to P1 dB.

The linearity and EVM performance of an amplifier can be improved also using digital pre-distortion (DPD). However, DPD requires a feedback loop and complex circuitry, both of which raise their own design and performance issues.

Accordingly, there is a need for achieving good AM-AM and AM-PM metrics while concurrently achieving good power, PAE, linearity, and EVM performance in an amplifier. The present invention addresses this need.

SUMMARY

The present invention encompasses circuits and methods for achieving good AM-AM and AM-PM metrics while concurrently achieving good power, PAE, linearity, and EVM performance in an amplifier. Embodiments of the present invention provide a new equalization approach which compensates for AM-AM and AM-PM variations in an amplifier by controlling bias conditions (such as bias voltage) versus output power to alter the AM-AM and AM-PM profiles imposed by the amplifier. The novel approach is applicable to all frequencies, technologies, and single-ended or differential amplifiers, particularly power amplifiers (PAs).

Differential amplifier embodiments include a first main field-effect transistor (FET) including a gate configured to receive a first input signal, a drain providing a first amplified output signal, and a source coupled to circuit ground; a second main FET including a gate configured to receive a second input signal, a drain providing a second amplified output signal, and a source coupled to circuit ground; and an equalization circuit coupled to the respective gates and drains of the first and second FETs and configured to generate an equalization voltage that alters the bias voltage to the gates of the respective first and second FETs in proportion to a power level present at the respective drains of the second and first FETs. Embodiments of the equalization circuit include a first equalization transistor including a drain coupled to the drain of the first main FET, a source coupled to the gate of the second main FET, and a gate configured to be coupled to a first bias voltage source; and a second equalization transistor including a drain coupled to the drain of the second main FET, a source coupled to the gate of the first main FET, and a gate configured to be coupled to a first bias voltage source.

Single-ended amplifier embodiments include a main FET including a gate configured to receive an input signal, a drain providing an amplified output signal, and a source coupled to circuit ground; and an equalization circuit coupled to the gate and drain of the main FET and configured to generate an equalization voltage that alters the bias voltage to the gate of the main FET in proportion to a power level present at the drain of the main FET. Embodiments of the equalization circuit include a transistor including a drain coupled to the drain of the main FET, a source coupled to the gate of the main FET, and a gate configured to be coupled to a bias voltage source, the equalization transistor configured to generate the equalization voltage.

Embodiments of the present invention may also provide a new linearization approach which compensates for AM-PM variation in an amplifier by pre-processing an input signal, such as a radio-frequency signal, to alter the AM-PM profile of the input signal so as to compensate for (essentially reverse) the AM-PM profile imposed by a coupled amplifier.

In embodiments that incorporate a linearizer circuit, the linearizer circuit includes a reflective hybrid coupler configured to receive an input signal to be linearized, the input signal having a first AM-PM profile, a first reflective modulation device coupled to the direct port of the reflective hybrid coupler, and a second reflective modulation device coupled to the coupled port of the reflective hybrid coupler, wherein the first and second reflective modulation devices modify the first AM-PM profile of the input signal to a modified output signal having a second AM-PM profile shaped to compensate for a third AM-PM profile imposed on the modified output signal by another device, such as a single-ended amplifier or a differential amplifier.

The details of one or more embodiments of the invention are set forth in the accompanying drawings and the description below. Other features, objects, and advantages of the invention will be apparent from the description and drawings, and from the claims.

DESCRIPTION OF THE DRAWINGS

FIG. 12 is a process flow chart showing one method of equalizing an output from a differential amplifier.

FIG. 13 is a process flow chart showing one method of equalizing an output from a single-ended amplifier.

Like reference numbers and designations in the various drawings indicate like elements.

DETAILED DESCRIPTION

Equalizer Circuit Embodiments

One aspect of the present invention encompasses circuits and methods for achieving good AM-AM and AM-PM metrics while concurrently achieving good power, PAE, linearity, and EVM performance in an amplifier. Embodiments of the present invention provide a new equalization approach which compensates for AM-AM and AM-PM variations in an amplifier by controlling bias conditions (such as bias voltage) versus output power to alter the AM-AM and AM-PM profiles imposed by the amplifier. The novel approach is applicable to all frequencies, technologies, and single-ended or differential amplifiers, particularly power amplifiers (PAs).

Figure 1A:
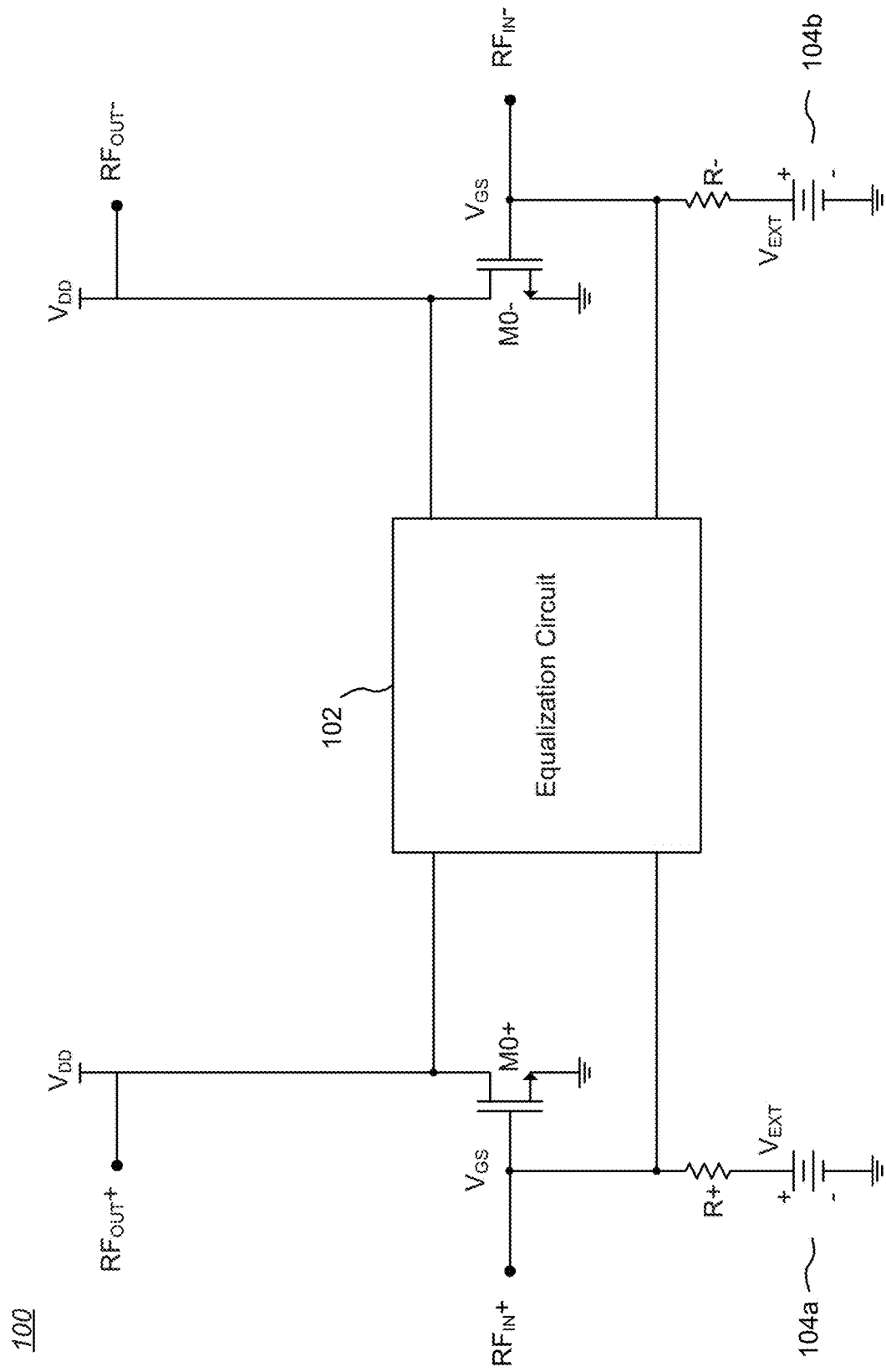
FIG. 1A is a schematic diagram of a first embodiment of a differential amplifier utilizing an equalization circuit in accordance with the present invention.

FIG. 1A is a schematic diagram of a first embodiment of a differential amplifier 100 utilizing an equalization circuit 102 in accordance with the present invention. In the illustrated example, the differential amplifier 100 includes positive and negative legs (note that plus and minus signs associated with an element label denote the associated leg and not an electrical polarity). Each leg of the differential amplifier 100 includes a main field-effect transistor (FET) M0+, M0−, which may be, for example, MOSFETs. The main FETs M0+, M0− have respective drains coupled to a source voltage $V_{DD}$ and respective sources coupled to circuit ground. The gates of the main FETs M0+, M0− are biased by a gate-source voltage $V_{GS}$ initially generated by a voltage $V_{EXT}$ from respective voltage sources 104a, 104b series-coupled by respective gate resistors R+, R−. A differential input signal, such as $RF_{IN}+$ and $RF_{IN}-$, applied to the gates of the main FETs M0+, M0− is amplified and output as differential output signal, such as $RF_{OUT}+$ and $RF_{OUT}-$.

For the differential amplifier 100, embodiments of the equalization circuit 102 include small cross-coupled common-gate (CCCG) transistors connected across the gate and drain of the main FETs M0+, M0− of the differential amplifier 100. The CCCG transistors sense the power level traveling through the main FETs M0+, M0− and allow a small DC current proportional to that power level to flow through the CCCG transistors. This DC current flows to circuit ground through the gate resistors of the main FETs M0+, M0−, generating an equalization voltage that alters the bias voltage to the gates of the main FETs M0+, M0− in proportion to the sensed power level. As a result, the gain of the main FETs M0+, M0− increases as the power level traveling through the main FETs M0+, M0− increases, resulting in improvement in the 1 dB compression point (P1 dB), and in the PAE, AM-AM, and AM-PM metrics of the amplifier. As described below, the equalization circuit 102 also may be adapted to provide equalization to a single-ended amplifier architecture.

The CCCG transistor(s) generally should be sized to be able to generate a small amount of corrective DC current, proportional to the power level flowing through the main FETs of an amplifier, without adversely affecting the performance of the amplifier. For example, the CCCG transistor(s) may be sized to be less than or equal to about one-sixth the size of the main FETs. However, other size ratios of the CCCG transistor(s) to the main FETs may be utilized as appropriate for particular applications.

Figure 1B:
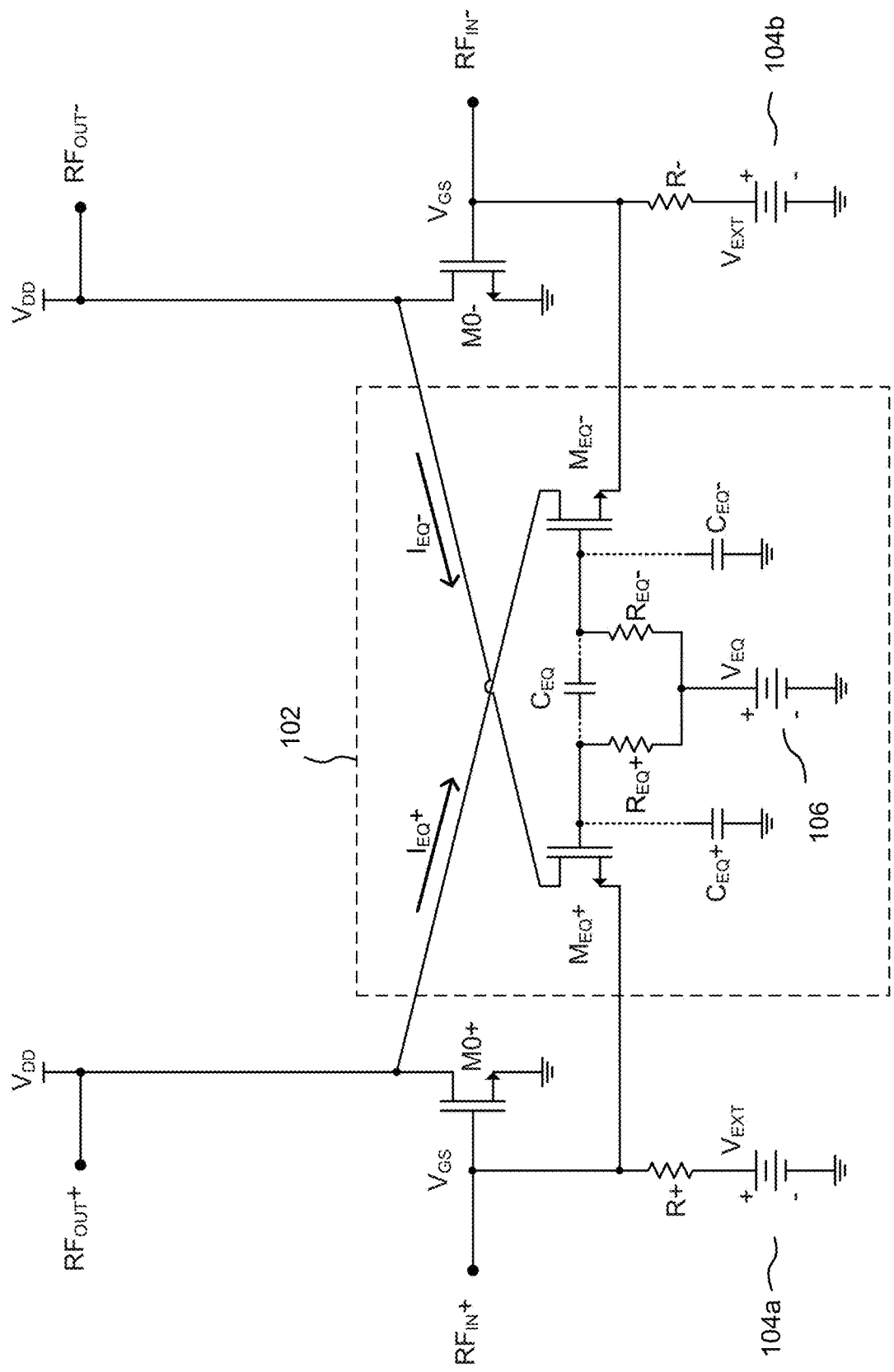
FIG. 1B is a schematic diagram of the differential amplifier of FIG. 1A, showing details of one embodiment of an equalization circuit in accordance with the present invention.

FIG. 1B is a schematic diagram of the differential amplifier 100 of FIG. 1A, showing details of one embodiment of an equalization circuit 102 in accordance with the present invention. The illustrated equalization circuit 102 includes first and second CCCG equalization transistors, $M_{EQ}+$ and $M_{EQ}-$, which may be, for example, MOSFETs. An equalization circuit bias voltage source 106 provides a bias voltage $V_{EQ}$ to the gates of transistors $M_{EQ}+$ and $M_{EQ}-$ through respective resistors $R_{EQ}+$ and $R_{EQ}-$. In order to provide a high quality factor AC ground for the gates of transistors $M_{EQ}+$ and $M_{EQ}-$, the resistors $R_{EQ}+$ and $R_{EQ}-$ preferably are relatively large (e.g., 5 K-ohms). The level of equalizer effect provided by the equalization circuit 102 can be controlled by setting $V_{EQ}$ to a selected value. As may be required for particular embodiments, the equalization circuit bias voltage source 106 may be set to provide a fixed voltage for $V_{EQ}$, or may provide a selectable (including dynamically determined) voltage for $V_{EQ}$. In some embodiments, separate first and second equalization circuit bias voltage sources (not shown) may be provided for, respectively, the first and second CCCG equalization transistors, $M_{EQ}+$ and $M_{EQ}-$.

In some embodiments, the gates of the transistors $M_{EQ}+$ and $M_{EQ}-$ may be coupled through a capacitor $C_{EQ}$. In alternative embodiments, the gate of each transistor $M_{EQ}+$, $M_{EQ}-$ may be coupled to circuit ground through a respective shunt capacitor $C_{EQ}+$, $C_{EQ}-$, omitting the capacitor $C_{EQ}$. Either capacitor configuration provides an RF ground at the gate of the transistors $M_{EQ}+$ and $M_{EQ}-$. Using a single differential capacitor $C_{EQ}$ is more compact than using dual capacitors $C_{EQ}+$, $C_{EQ}-$, but either configuration may be used. A principal purpose of RF grounding the gates of transistors $M_{EQ}+$ and $M_{EQ}-$ is to provide better RF to DC conversion.

In the illustrated example, the drain of transistor $M_{EQ}+$ is coupled to the drain of main FET M0− and the source of transistor $M_{EQ}+$ is coupled to the gate of main FET M0+. Similarly, the drain of transistor $M_{EQ}-$ is coupled to the drain of main FET M0+ and the source of transistor $M_{EQ}-$ is coupled to the gate of main FET M0−. Cross-coupling of the CCCG transistors $M_{EQ}+$ and $M_{EQ}-$ helps correct imbalances between the positive and negative legs of the differential amplifier 100 that may occur, for example, if a balun is used to convert a single-ended, ground-referenced input signal (e.g., $RF_{IN}$) to differential, balanced RF signals (e.g., $RF_{IN}+$ and $RF_{IN}-$).

In operation, the biased gates of the CCCG transistors $M_{EQ}+$ and $M_{EQ}-$ allow a respective small DC equalizer current $I_{EQ}-$, $I_{EQ}+$ to flow from the respective drains of the cross-coupled main FETs M0−, M0+ to the respective sources of the CCCG transistors $M_{EQ}+$ and $M_{EQ}-$. The equalizer currents $I_{EQ}+$, $I_{EQ}-$ are proportional to the output power of the respective coupled main FETs M0+, M0−. Since the sources of the CCCG transistors $M_{EQ}+$ and $M_{EQ}-$ are respectively coupled to the gates of main FETs M0+, M0−, the small DC equalizer currents $I_{EQ}-$, $I_{EQ}+$ flow to circuit ground through the respective gate resistors R+, R−, generating an equalization voltage that alters the bias voltage $V_{GS}$ applied to the respective gates of the main FETs M0+, M0− in proportion to the power level sensed by the CCCG transistors $M_{EQ}+$, $M_{EQ}-$. As a result, the gain of the main FETs M0+, M0− increases as the power level traveling through the main FETs M0+, M0− increases, resulting in improvement in the 1 dB compression point (P1 dB), and in the PAE, AM-AM, and AM-PM metrics of the differential amplifier 100.

Figure 2:
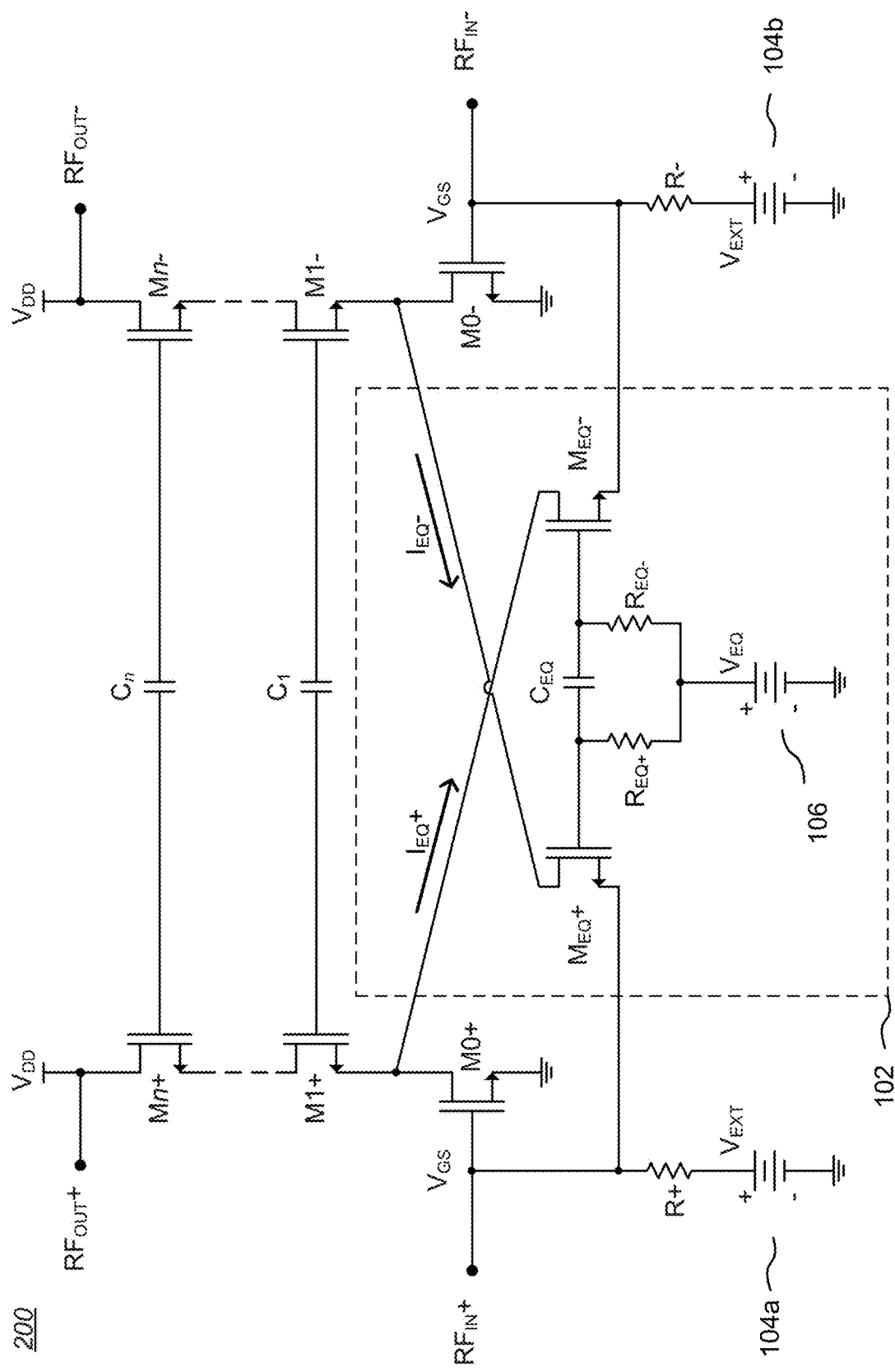
FIG. 2 is a schematic diagram of a second embodiment of a differential amplifier utilizing an equalization circuit in accordance with the present invention.

The equalization circuit 102 may be used in conjunction with other amplifier architectures. For example, FIG. 2 is a schematic diagram of a second embodiment of a differential amplifier 200 utilizing an equalization circuit 102 in accordance with the present invention. To allow for higher voltages for $V_{DD}$, each leg of the differential amplifier 200 includes a respective stack of one or more transistors, M1+− . . . Mn+ and M1− . . . Mn−, series coupled to the drain of the main FETs M0+, M0−, where "n" is the stack height of the added transistors M1+− . . . Mn+, M1− . . . Mn−. In the illustrated example, the gates of the transistors M1+− . . . Mn+, M1− . . . Mn− are coupled by respective capacitors $C_1$ . . . $C_n$. The equalization circuit 102 operates as described above with respect to FIG. 1B.

Figure 3:
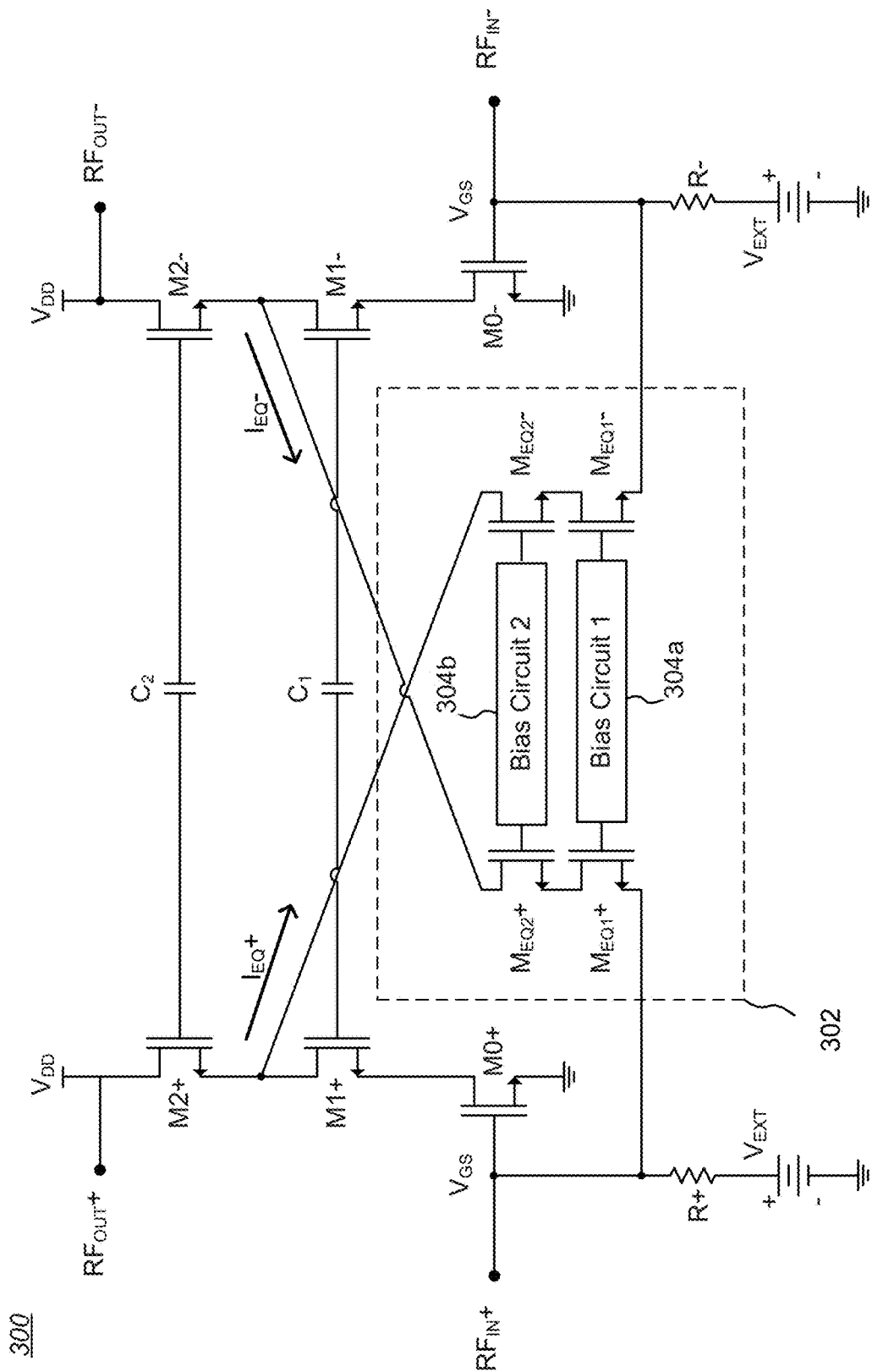
FIG. 3 is a schematic diagram of a third embodiment of a differential amplifier utilizing a modified equalization circuit in accordance with the present invention.

As another example of an alternative amplifier architecture, FIG. 3 is a schematic diagram of a third embodiment of a differential amplifier 300 utilizing a modified equalization circuit 302 in accordance with the present invention. Each leg of the differential amplifier 300 includes a respective stack of two additional transistors, M1+, M2+ and M1−, M2−, series coupled to the drain of the main FETs M0+, M0−. The gates of the stack transistors M1+, M2+ and M1−, M2−, are coupled by respective capacitors $C_1$, $C_2$. In the illustrated example, an equalization circuit 302 has a similar configuration to the equalization circuits 102 of FIGS. 1B and 2, but is connected to the drain of stack transistors M1+ and M1−. Further, to accommodate the higher voltages at the respective drains of stack transistors M1+ and M1−, the first and second CCCG transistors $M_{EQ}+$ and $M_{EQ}-$ of FIG. 1B may be implemented as a stack of CCCG transistors, in this case $M_{EQ1}+$ and $M_{EQ2}+$ coupled between the drain of stack transistor M1− and the gate of main FET M0+, and $M_{EQ1}-$ and $M_{EQ2}-$ coupled between the drain of stack transistor M1+ and the gate of main FET M0−. Each level in the stack of CCCG transistors may have its own bias circuit 304a, 304b, which may be similar to the bias circuit shown in FIG. 2, comprising capacitor $C_{EQ}$, resistors $R_{EQ}+$ and $R_{EQ}-$, and a bias voltage $V_{EQ}$. As should be appreciated, couplings of the modified equalization circuit 302 to the drains of other stack transistors (e.g., M2+, M2−) can be effected in combination with the potential need to also increase the stack height n of the CCCG transistors (e.g., 3 transistors per $M_{EQ}$ stack).

Of note, the differential amplifiers 100, 200, 300 may be, for example, an LNA or a PA. The equalization circuits 102, 302 may be used with a differential or balanced differential amplifier architecture, as further illustrated in FIGS. 4A and 5A described below. In alternative embodiments, the equalization circuits 102, 302 may be adapted for use with a single-ended amplifier architecture, as further illustrated in FIG. 6A described below.

Equalizer Circuit Embodiments—Examples and Results

Figure 4A:
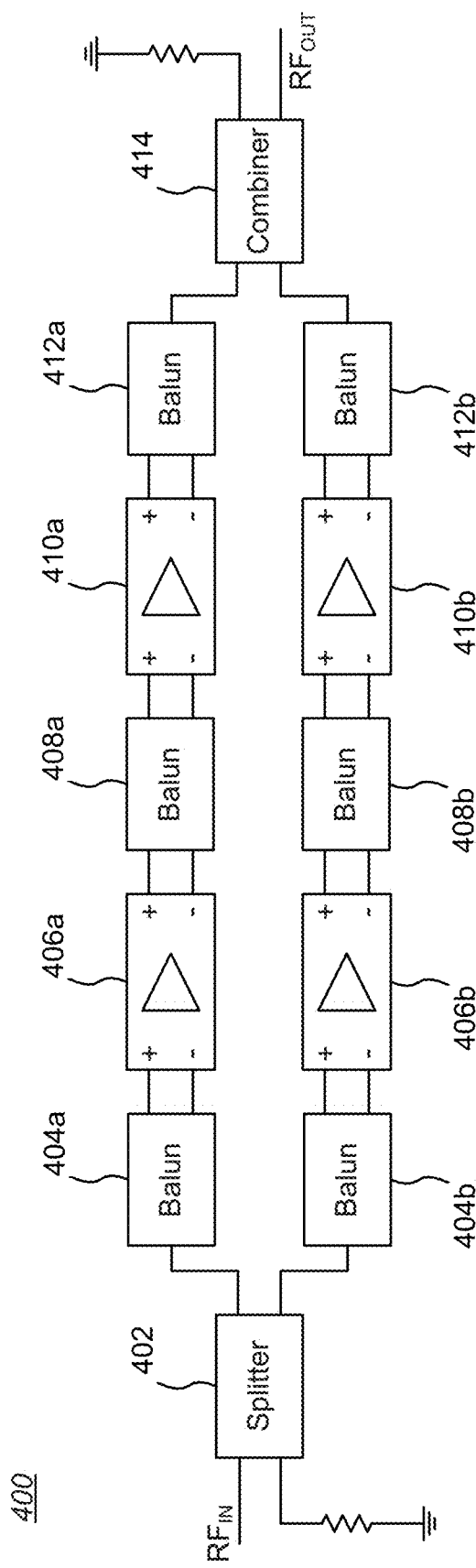
FIG. 4A is an example of a 2-stage balanced differential amplifier circuit in which one or more amplifier elements utilize an equalization circuit in accordance with the present invention.

FIG. 4A is an example of a 2-stage balanced differential amplifier circuit 400 in which one or more amplifier elements utilize an equalization circuit in accordance with the present invention. In the illustrated example, a conventional power splitter 402 is configured to receive an input signal, $RF_{IN}$, and provide approximately equal power input signals to two legs of the balanced differential amplifier circuit 400. Each leg includes a first balun 404a, 404b configured to receive a respective power input signal from the power splitter 402. The first baluns 404a, 404b convert the received power input signal from a single-ended signal to a differential, balanced signal.

Coupled to the first baluns 404a, 404b are respective first stage differential amplifiers 406a, 406b, which provide amplified differential signals to respective second baluns 408a, 408b. The second baluns 408a, 408b are coupled to respective second stage differential amplifiers 410a, 410b. The second baluns 408a, 408b serve to make biasing of the first stage differential amplifiers 406a, 406b easier, provide a load for the first stage differential amplifiers 406a, 406b, and provide impedance transformation from the first stage differential amplifiers 406a, 406b to the second stage differential amplifiers 410a, 410b.

The second stage differential amplifiers 410a, 410b provide amplified differential signals to respective third baluns 412a, 412b, which convert the received amplified differential signals to a single-ended signal. A conventional combiner circuit 414 is coupled to the third baluns 412a, 412b and outputs a combined amplified signal, $RF_{OUT}$.

At least one stage of differential amplifier pairs 406a, 406b and/or 410a, 410b includes an equalization circuit 102 in accordance with the teachings of this disclosure, and all differential amplifiers 406a, 406b, 410a, 410b may include an equalization circuit 102 in accordance with the teachings of this disclosure. As should be clear, additional stages may be added.

Figure 4B:
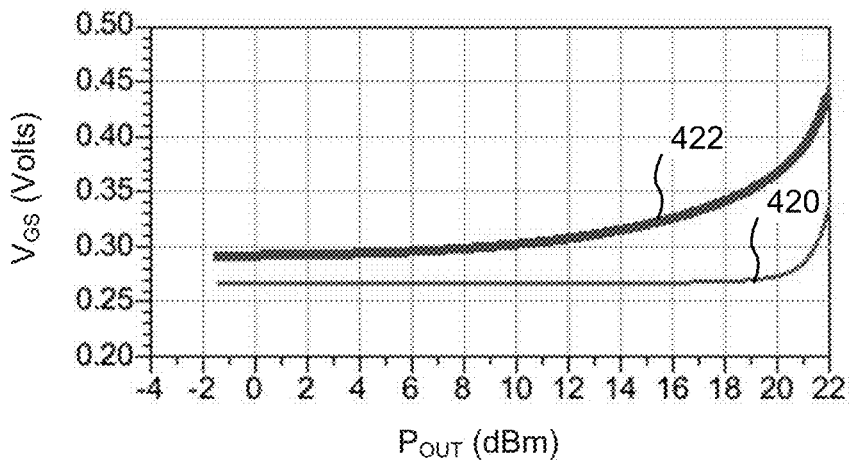
FIG. 4B is a graph of $V_{GS}$ (as in FIG. 1B) as a function of output power for a modeled embodiment of a 2-stage balanced differential amplifier circuit of the type shown in FIG. 4A.

FIG. 4B is a graph of $V_{GS}$ (as in FIG. 1B) as a function of output power for a modeled embodiment of a 2-stage balanced differential amplifier circuit 400 of the type shown in FIG. 4A. Graph line 420 shows the change in $V_{GS}$ as a function of output power for an embodiment of the amplifier circuit 400 without an equalization circuit, while graph line 422 shows the change in $V_{GS}$ as a function of output power for an embodiment of the amplifier circuit 400 in which each second stage differential amplifier 410a, 410b includes an equalization circuit 102. As power increases, $V_{GS}$ rises more when an equalization circuit 102 is present, signifying that the equalizer currents $I_{EQ}-$, $I_{EQ}+$ (see FIG. 1B) also increase in proportion to power output.

Figure 4C:
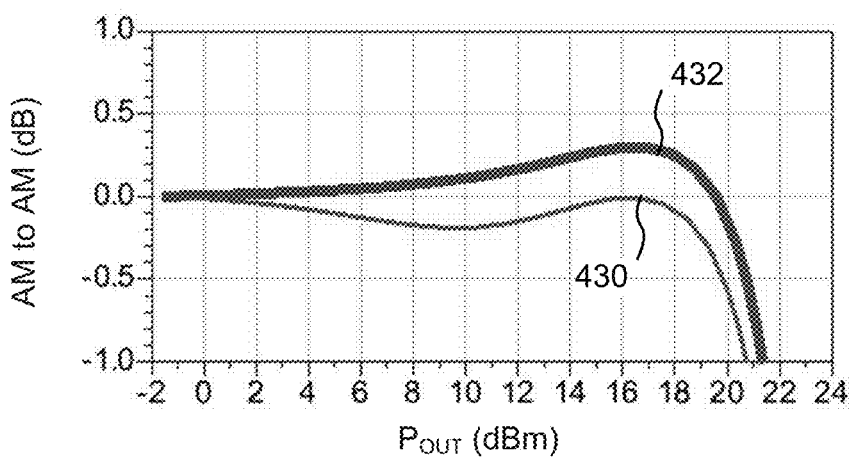
FIG. 4C is a graph of the AM-AM metric as a function of output power for a modeled embodiment of a 2-stage balanced differential amplifier circuit of the type shown in FIG. 4A.

FIG. 4C is a graph of the AM-AM metric as a function of output power for a modeled embodiment of a 2-stage balanced differential amplifier circuit 400 of the type shown in FIG. 4A. Graph line 430 shows the change in the AM-AM metric as a function of output power for an embodiment of the amplifier circuit 400 without an equalization circuit, while graph line 432 shows the change in the AM-AM metric as a function of output power for an embodiment of the amplifier circuit 400 in which each differential amplifier 406a, 406b, 410a, 410b includes an equalization circuit 102. As power increases, the AM-AM metric is generally flatter overall when an equalization circuit 102 is present.

Figure 4D:
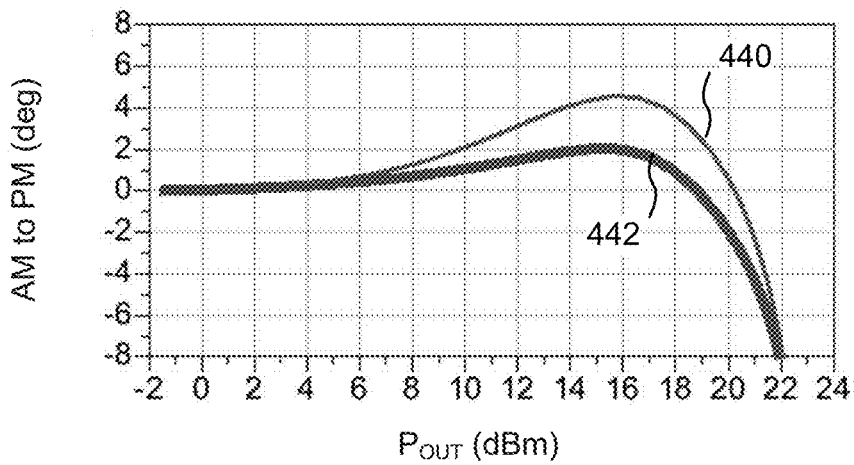
FIG. 4D is a graph of the AM-PM metric as a function of output power for a modeled embodiment of a 2-stage balanced differential amplifier circuit of the type shown in FIG. 4A.

FIG. 4D is a graph of the AM-PM metric as a function of output power for a modeled embodiment of a 2-stage balanced differential amplifier circuit 400 of the type shown in FIG. 4A. Graph line 440 shows the change in the AM-PM metric as a function of output power for an embodiment of the amplifier circuit 400 without an equalization circuit, while graph line 432 shows the change in the AM-PM metric as a function of output power for an embodiment of the amplifier circuit 400 in which each differential amplifier 406a, 406b, 410a, 410b includes an equalization circuit 102. As power increases, the AM-PM metric is much flatter overall when an equalization circuit 102 is present.

In addition, for the modeled embodiment of a 2-stage balanced differential amplifier circuit 400 of the type shown in FIG. 4A, P1 dB increased by about 0.7 dBm and PAE at P1 dB increased by about 2 percentage points when an equalization circuit 102 was present compared to those measurements without the equalization circuit 102.

Figure 5A:
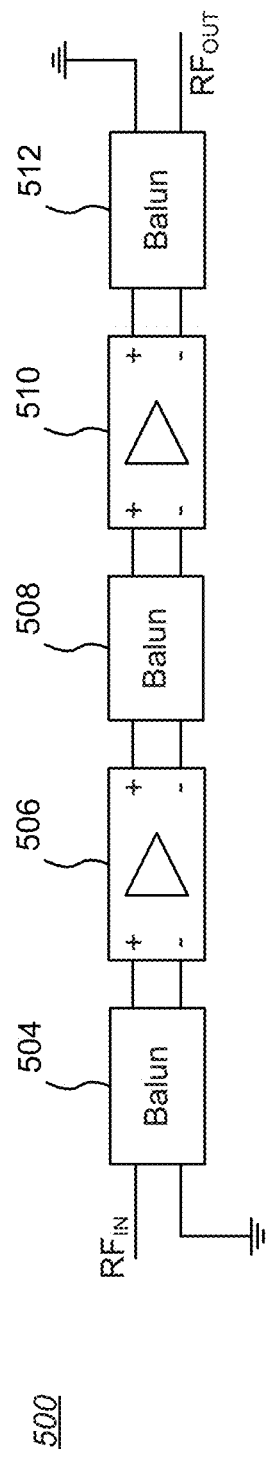
FIG. 5A is an example of a 2-stage differential amplifier circuit in which one or more of the amplifier elements utilizes an equalization circuit in accordance with the present invention.

FIG. 5A is an example of a 2-stage differential amplifier circuit 500 in which one or more of the amplifier elements utilizes an equalization circuit in accordance with the present invention. The amplifier circuit 500 is generally similar to one leg of the 2-stage balanced differential amplifier circuit 400 shown in FIG. 4A. In the illustrated example, a first balun 504 is configured to receive an input signal, $RF_{IN}$, and convert the received input signal from a single-ended signal to a differential, balanced signal. Coupled to the first balun 504 is a first stage differential amplifier 506, which provides amplified differential signals to a second balun 508. The second balun 508 is coupled to a second stage differential amplifier 510. The second balun 508 serves to make biasing of the first stage differential amplifier 506 easier, provide a load for the first stage differential amplifier 506, and provide impedance transformation from the first stage differential amplifier 506 to the second stage differential amplifier 510. The second stage differential amplifier 510 provides amplified differential signals to a third balun 512, which converts the received amplified differential signals to a single-ended signal as the output, $RF_{OUT}$ of the 2-stage differential amplifier circuit 500.

At least one stage of differential amplifiers 506 and/or 510 includes an equalization circuit 102 in accordance with the teachings of this disclosure, and both differential amplifiers 506, 510 may include an equalization circuit 102 in accordance with the teachings of this disclosure. As should be clear, additional stages may be added.

Figure 5B:
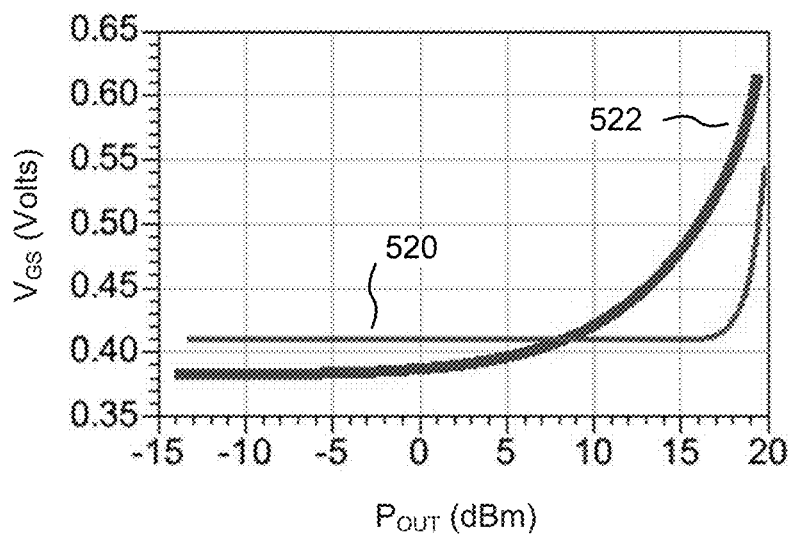
FIG. 5B is a graph of $V_{GS}$ (as in FIG. 1B) as a function of output power for a modeled embodiment of a 2-stage differential amplifier circuit of the type shown in FIG. 5A.

FIG. 5B is a graph of $V_{GS}$ (as in FIG. 1B) as a function of output power for a modeled embodiment of a 2-stage differential amplifier circuit 500 of the type shown in FIG. 5A. Graph line 520 shows the change in $V_{GS}$ as a function of output power for an embodiment of the amplifier circuit 500 without an equalization circuit, while graph line 522 shows the change in $V_{GS}$ as a function of output power for an embodiment of the amplifier circuit 500 in which the second stage differential amplifier 510 includes an equalization circuit 102. As power increases, $V_{GS}$ rises more when an equalization circuit 102 is present, signifying that the equalizer currents $I_{EQ}-$, $I_{EQ}+$(see FIG. 1B) also increase in proportion to power output.

Figure 5C:
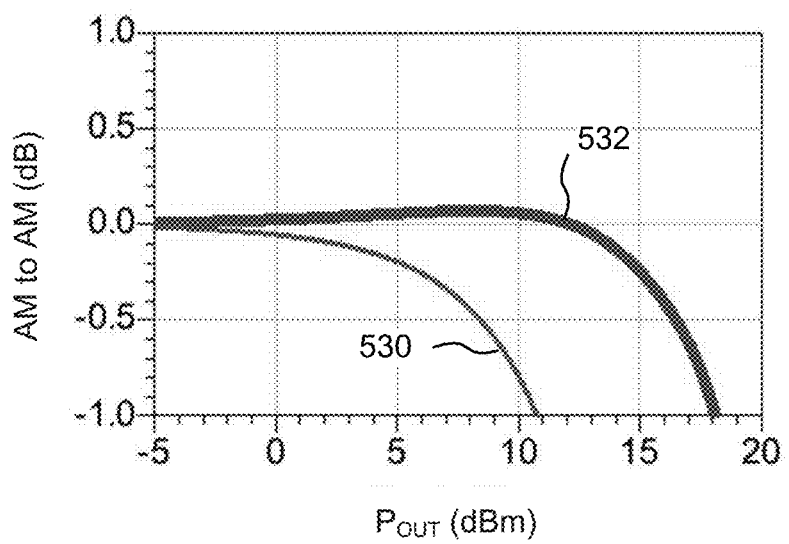
FIG. 5C is a graph of the AM-AM metric as a function of output power for a modeled embodiment of a 2-stage differential amplifier circuit of the type shown in FIG. 5A.

FIG. 5C is a graph of the AM-AM metric as a function of output power for a modeled embodiment of a 2-stage differential amplifier circuit 500 of the type shown in FIG. 5A. Graph line 530 shows the change in the AM-AM metric as a function of output power for an embodiment of the amplifier circuit 500 without an equalization circuit, while graph line 532 shows the change in the AM-AM metric as a function of output power for an embodiment of the amplifier circuit 500 in which each differential amplifier 506, 510 includes an equalization circuit 102. As power increases, the AM-AM metric is much flatter overall when an equalization circuit 102 is present.

Figure 5D:
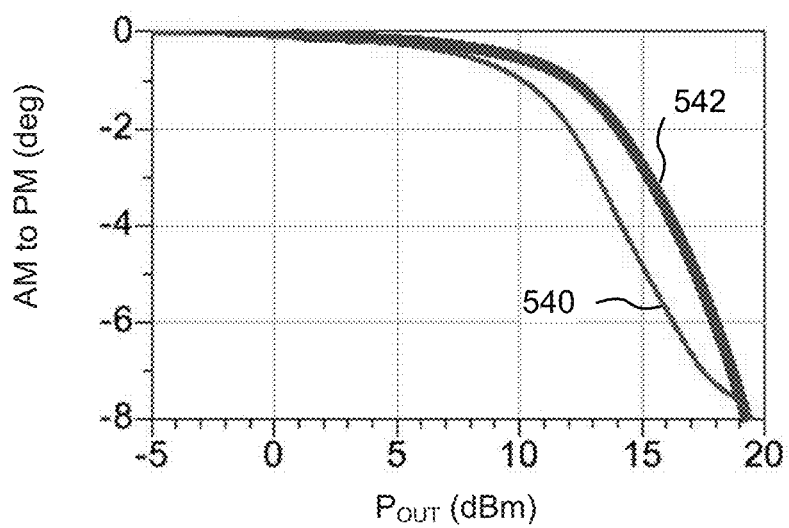
FIG. 5D is a graph of the AM-PM metric as a function of output power for a modeled embodiment of a 2-stage differential amplifier circuit of the type shown in FIG. 5A.

FIG. 5D is a graph of the AM-PM metric as a function of output power for a modeled embodiment of a 2-stage differential amplifier circuit 500 of the type shown in FIG. 5A. Graph line 540 shows the change in the AM-PM metric as a function of output power for an embodiment of the amplifier circuit 500 without an equalization circuit, while graph line 542 shows the change in the AM-PM metric as a function of output power for an embodiment of the amplifier circuit 500 in which each differential amplifier 506, 510 includes an equalization circuit 102. As power increases, the AM-PM metric is generally flatter overall when an equalization circuit 102 is present.

In addition, for the modeled embodiment of a 2-stage differential amplifier circuit 500 of the type shown in FIG. 5A, P1 dB increased by about 7.4 dBm and PAE at P1 dB increased by about 14.3 percentage points when an equalization circuit 102 was present compared to those measurements without the equalization circuit 102.

Figure 6A:
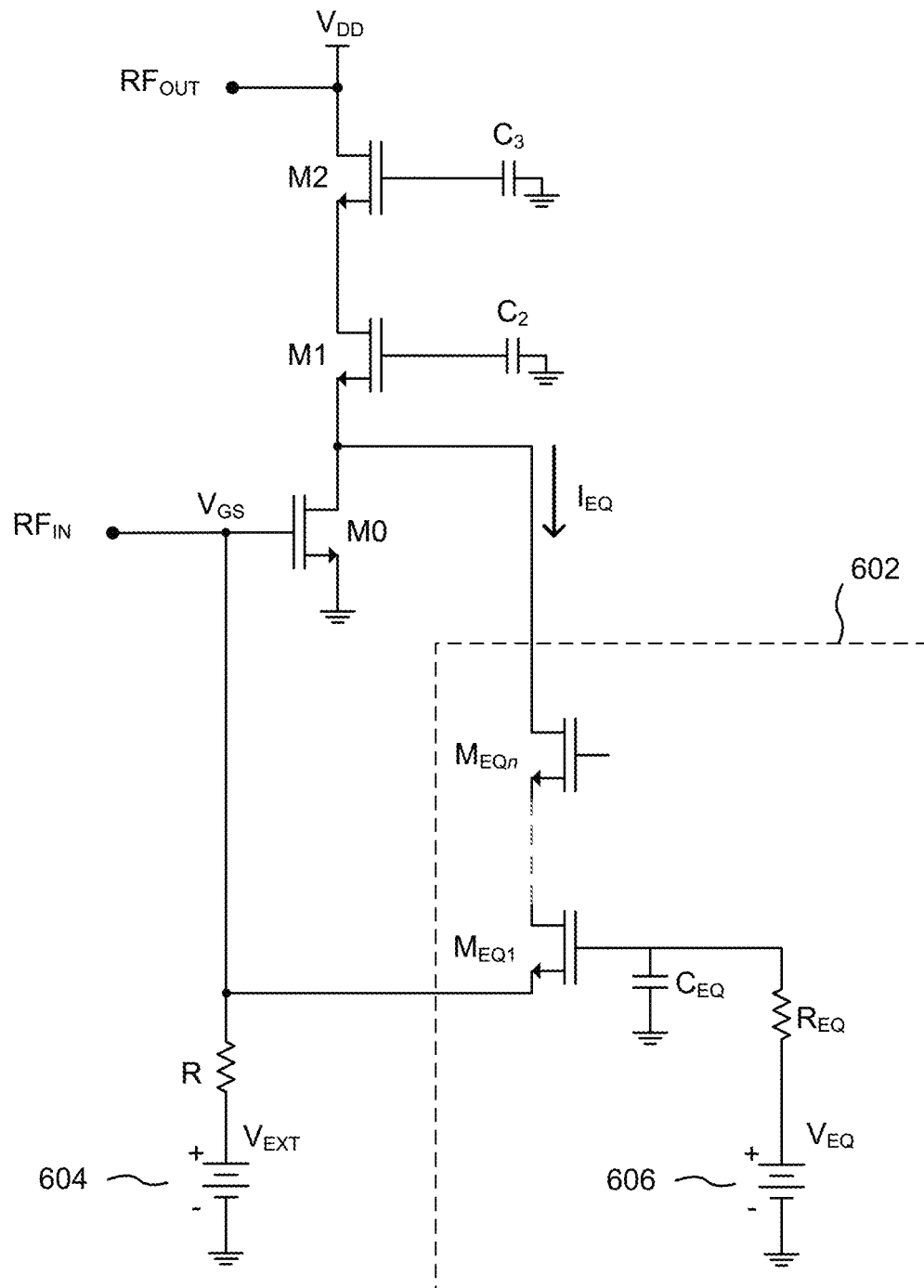
FIG. 6A is a schematic diagram of one embodiment of a single-ended amplifier utilizing a modified equalization circuit in accordance with the present invention.

FIG. 6A is a schematic diagram of one embodiment of a single-ended amplifier 600 utilizing a modified equalization circuit 602 in accordance with the present invention. In the illustrated example, the single-ended amplifier 600 includes a main field-effect transistor (FET) M0, which may be, for example, a MOSFET. The main FET M0 has a drain coupled to a source voltage $V_{DD}$ and a source coupled to circuit ground. The gate of the main FET M0 is biased by a gate-source voltage $V_{GS}$ initially generated by a voltage $V_{EXT}$ from a voltage source 604 series-coupled by a gate resistor R. The single-ended amplifier 600 includes a stack of two additional transistors, M1, M2 series coupled to the drain of the main FET M0. The gates of the stack transistors M1, M2, are coupled by respective capacitors $C_1$, $C_2$ to circuit ground. An input signal, such as $RF_{IN}$, applied to the gate of the main FET M0 is amplified and output as $RF_{OUT}$. As should be clear, the stack height of the additional transistors may be any desired number (including zero), and multiple stages of the single-ended amplifier 600 may be concatenated to form a multi-stage single-ended amplifier circuit.

The illustrated equalization circuit 602 includes a stack of CCCG equalization transistors, $M_{EQ1}$-$M_{EQn}$, which may be, for example, MOSFETs with suitable biasing and where n≥1. An equalization circuit bias voltage source 606 provides a bias voltage $V_{EQ}$ to the gate of transistor $M_{EQ1}$ through a resistor $R_{EQ}$. The level of equalizer effect provided by the equalization circuit 602 can be controlled by setting $V_{EQ}$ to a selected value. As may be required for particular embodiments, the equalization circuit bias voltage source 606 may be set to provide a fixed voltage for $V_{EQ}$, or may provide a selectable (including dynamically determined) voltage for $V_{EQ}$.

The gate of transistor $M_{EQ1}$ is coupled to circuit ground through a shunt capacitor $C_{EQ}$. The drain of transistor $M_{EQn}$ is coupled to the drain of the main FET M0 and the source of transistor $M_{EQ1}$ is coupled to the gate of the main FET M0.

Note that the CCCG transistor stack $M_{EQ1}$-$M_{EQn}$, while technically in a common gate configuration in parallel with the main FET M0, does not contribute any significant amount to amplification of the RF input signal $RF_{IN}$ because the FET stack $M_{EQ1}$-$M_{EQn}$ is sized to be much smaller in size than FET M0 and the gain of the common gate configuration is much less than the gain of the common source M0 FET. This comment applies as well to the differential amplifier configurations described above.

In operation, the biased gate of the CCCG transistor $M_{EQ1}$ allows a respective small DC equalizer current $I_{EQ}$ to flow from the drain of the main FET M0 to the source of the CCCG transistor $M_{EQ1}$. The equalizer current $I_{EQ}$ is proportional to the output power of the coupled main FET M0. Since the source of the CCCG transistor $M_{EQ1}$ is coupled to the gate of the main FET M0, the small DC equalizer current $I_{EQ}$ flows to circuit ground through the gate resistor R, generating an equalization voltage that alters the bias voltage $V_{GS}$ applied to the gate of the main FET M0 in proportion to the power level sensed by the CCCG transistor $M_{EQ1}$. As a result, the gain of the main FET M0 increases as the power level traveling through the main FET M0 increases, resulting in improvement in the 1 dB compression point (P1 dB), and in the PAE, AM-AM, and AM-PM metrics of the single-ended amplifier 600.

Figure 6B:
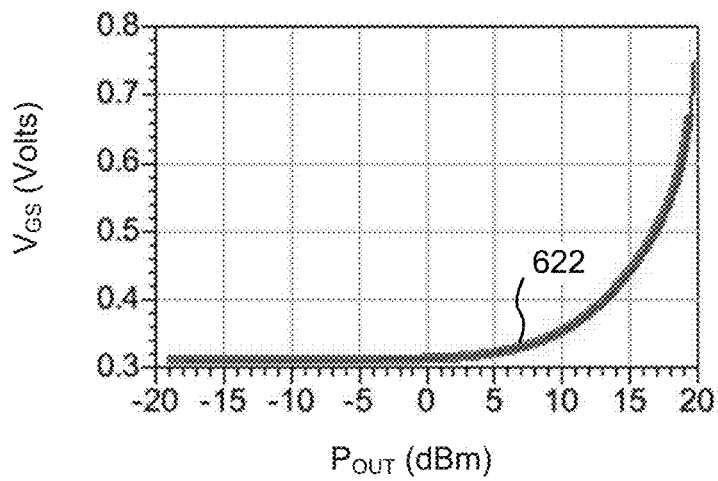
FIG. 6B is a graph of $V_{GS}$ (as in FIG. 1B) as a function of output power for a modeled embodiment of a single-ended amplifier circuit of the type shown in FIG. 6A, including an equalization circuit.

FIG. 6B is a graph of $V_{GS}$ (as in FIG. 1B) as a function of output power for a modeled embodiment of a single-ended amplifier circuit 600 of the type shown in FIG. 6A, including an equalization circuit 602. Note that graph line 622 is actually 3 different (but overlying) curves representing $V_{GS}$ as a function of output power for 3 different frequencies (26 GHz, 28 GHz, and 30 GHz in this example).

As power increases, $V_{GS}$ rises when an equalization circuit 602 is present, signifying that the equalizer current $I_{EQ}$ (see FIG. 6A) also increases in proportion to power output. FIG. 6B shows that the increase of $V_{GS}$ as a function of output power is essentially frequency independent.

Figure 6C:
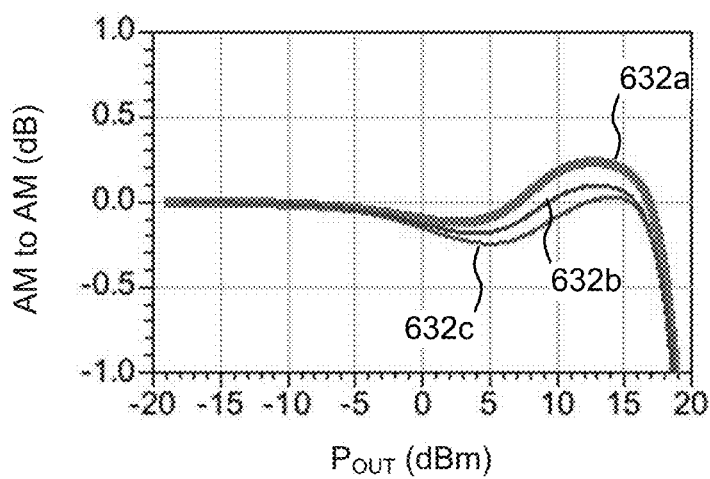
FIG. 6C is a graph of the AM-AM metric as a function of output power for a modeled embodiment of a single-ended amplifier circuit of the type shown in FIG. 6A, including an equalization circuit.

FIG. 6C is a graph of the AM-AM metric as a function of output power for a modeled embodiment of a single-ended amplifier circuit 600 of the type shown in FIG. 6A, including an equalization circuit 602. Graph line 632a shows the change in the AM-AM metric as a function of output power at 30 GHz. Graph line 632b shows the change in the AM-AM metric as a function of output power at 28 GHz. Graph line 632c shows the change in the AM-AM metric as a function of output power at 26 GHz. FIG. 6C shows that changes in the AM-AM metric as a function of output power varies was very stable over the bandwidth.

Figure 6D:
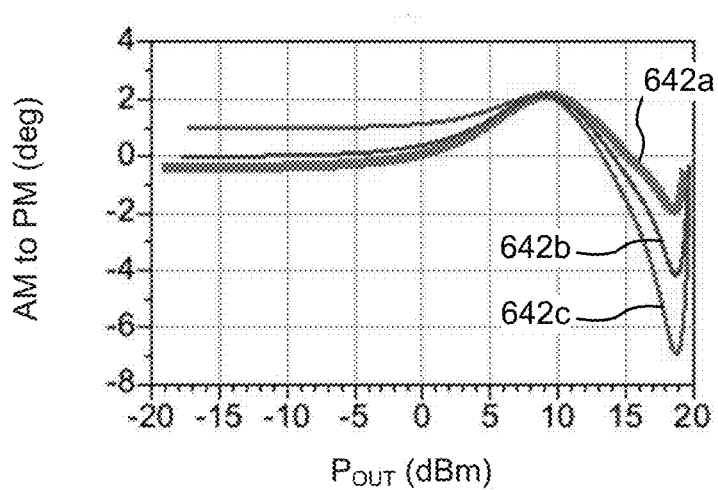
FIG. 6D is a graph of the AM-PM metric as a function of output power for a modeled embodiment of a single-ended amplifier circuit of the type shown in FIG. 6A, including an equalization circuit.

FIG. 6D is a graph of the AM-PM metric as a function of output power for a modeled embodiment of a single-ended amplifier circuit 600 of the type shown in FIG. 6A, including an equalization circuit 602. Graph line 642a shows the change in the AM-AM metric as a function of output power at 30 GHz. Graph line 642b shows the change in the AM-AM metric as a function of output power at 28 GHz. Graph line 642c shows the change in the AM-AM metric as a function of output power at 26 GHz. FIG. 6D shows that changes in of the AM-AM metric as a function of output power varies was very stable over the bandwidth.

In addition, for the modeled embodiment of a single-ended amplifier circuit 600 of the type shown in FIG. 6A, PAE at P1 dB was about 48%, PAE at 8 dB back-off was about 19%, and AM-PM at P1 dB was about 4 degrees, all excellent metrics.

Linearizer Circuit Embodiments

Another aspect of the present invention encompasses circuits and methods that provide a new linearization approach which compensates for AM-PM variation in an amplifier by pre-processing an input signal, such as a radio-frequency (RF) signal, to alter the AM-PM profile of the input signal so as to compensate for (essentially reverse) the AM-PM profile imposed by a coupled amplifier.

The new linearization approach couples an input signal through the input port of a reflective hybrid coupler having direct and coupled ports each terminated with a FET. The FET may be, for example, an N-type enhancement MOSFET. The output port (also known as the "isolated" port) of the reflective hybrid coupler is connected to the input of an amplifier, such as a power amplifier, having one or more amplification stages.

Figure 7A:
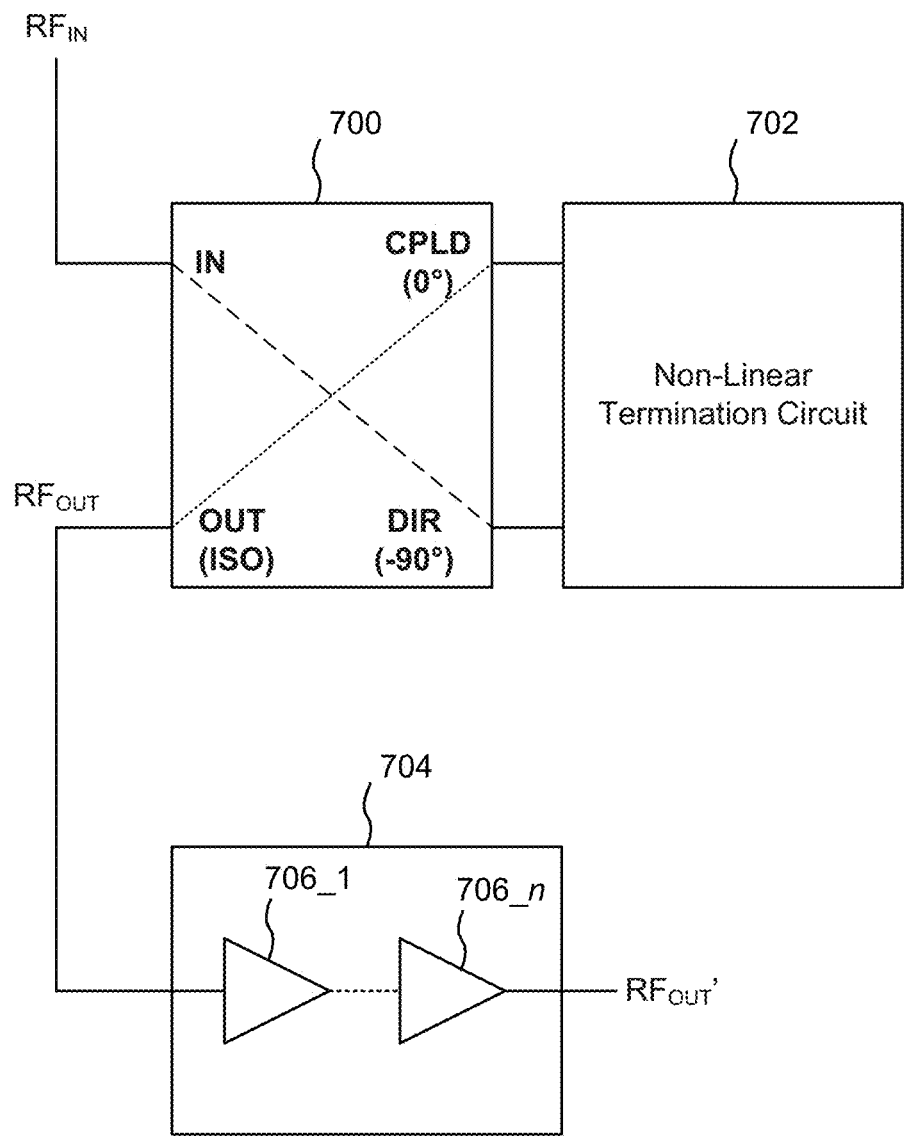
FIG. 7A is a schematic diagram of one embodiment of a linearizer circuit using a reflective hybrid coupler and a non-linear termination circuit.

FIG. 7A is a schematic diagram of one embodiment of a linearizer circuit using a reflective hybrid coupler 700 and a non-linear termination circuit 702. As is known in the art, a reflective hybrid coupler is a four-port device (input, direct, coupled, isolated) that may be used either to equally split an input signal with a resultant 90° phase shift between output ports, or to combine two signals while maintaining high isolation between the ports. Reflective hybrid couplers are also known as quadrature hybrids because a signal applied to any input will result in two equal amplitude signals that are 90° apart.

In the illustrated example, an input signal (shown in this example as an RF input signal $RF_{IN}$) is coupled to the input port IN of the reflective hybrid coupler 700. One half of the power (−3 dB) of the input signal flows to the direct port DIR and the other half of the power (−3 dB) of the input signal flows to the coupled port CPLD. As indicated, the direct port DIR and the coupled port CPLD have a 90° phase difference. The output port OUT of the reflective hybrid coupler 700 provides an output signal (shown in this example as an RF output signal $RF_{OUT}$) having a modified AM-PM profile to the input of an amplifier 704. The amplifier 704 may include one or more amplifier stages 706_1-706_n and outputs an amplified signal (shown in this example as an RF output signal $RF_{OUT}'$) that has a compensated AM-PM profile. The amplifier 704 may be, for example, an LNA or a PA, and may, for example, have a single-ended, differential, or balanced differential architecture.

Within the reflective hybrid coupler 700, the input signal is split into Direct and Coupled signals that travel to the direct port DIR and the coupled port CPLD, respectively, which are coupled to a non-linear termination circuit 702. A characteristic of the non-linear termination circuit 702 is that it includes devices (such as an N-type enhancement MOSFETs) that have an inherent non-linear characteristic modulated by varying (modulating) the input voltage $V_{GS}$ from the Direct and Coupled signals. Further, since such devices typically have a non-linear gate-source capacitance, $C_{GS}$, that non-linearity adds to the overall non-linearity of the FET.

Figure 7B:
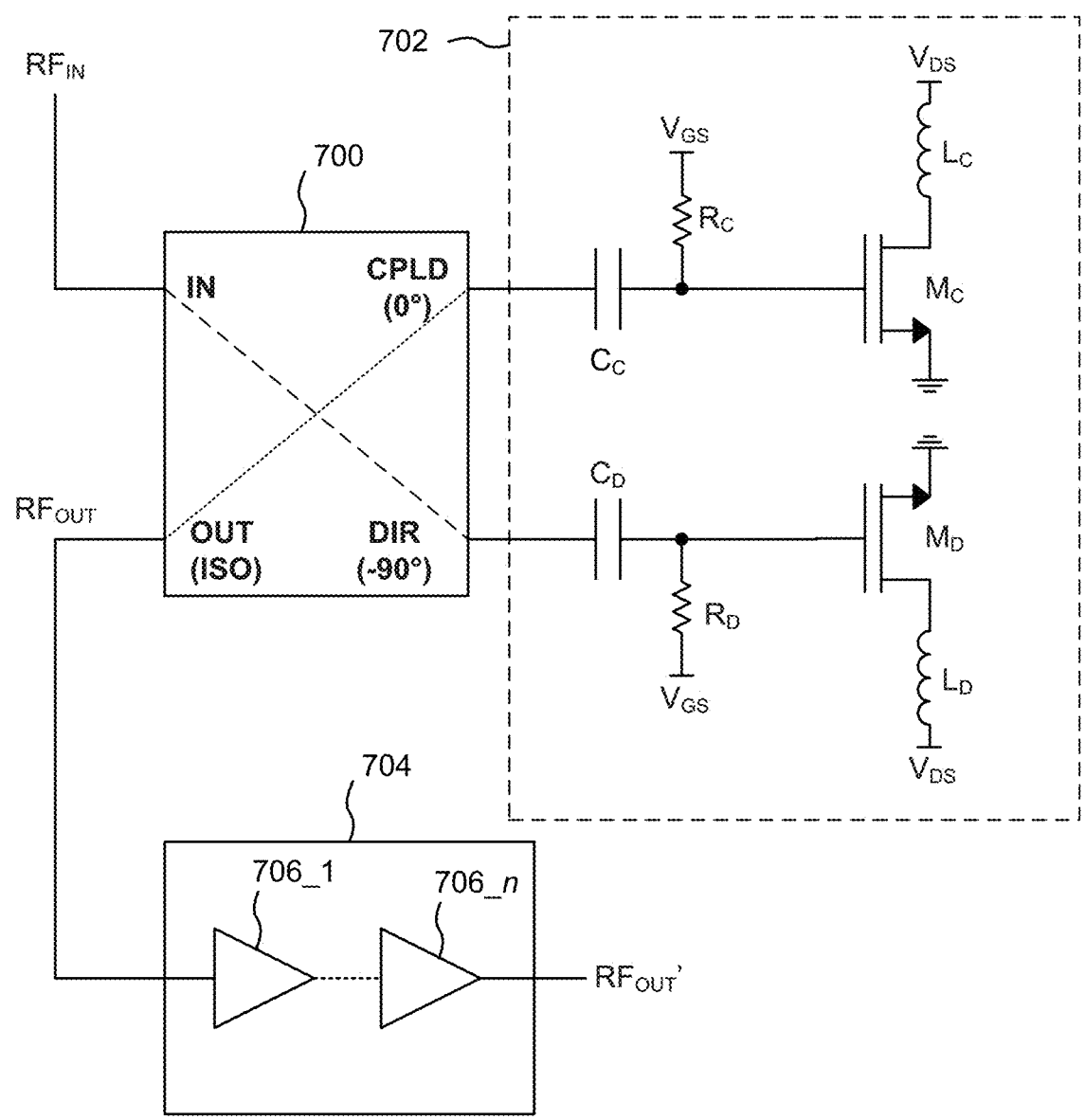
FIG. 7B is a schematic diagram of the linearizer circuit of FIG. 7A using a particular example of a non-linear termination circuit.

A variety of such FET-based circuits with such characteristics may be used. For example, FIG. 7B is a schematic diagram of the linearizer circuit of FIG. 7A using a particular example of a non-linear termination circuit 702. More particularly, the coupled port CPLD is coupled through a DC-blocking capacitor $C_C$ to a control terminal of a reflective modulation device; in the illustrated example, the reflective modulation device is a FET $M_C$, and the control terminal is the gate of the FET $M_C$. Similarly, the direct port DIR is coupled through a DC-blocking capacitor $C_D$ to a control terminal of a reflective modulation device; in the illustrated example, the reflective modulation device is a FET $M_D$, and the control terminal is the gate of the FET $M_D$. In the illustrated example, a bias voltage $V_{GS}$ is applied to the gate of each FET $M_C$, $M_D$ via respective gate resistors $R_C$, $R_D$, and the drain of each FET $M_C$, $M_D$ is coupled to a drain-source bias voltage supply $V_{DS}$ (e.g., +1V) through a respective load inductor $L_C$, $L_D$. In alternative embodiments, the drain of both FETs $M_C$, $M_D$ may be coupled to the drain-source bias voltage supply $V_{DD}$ through a common load inductor.

The load inductors $L_C$ and $L_D$ not only pass current to the FETs $M_C$ and $M_D$, respectively, but also provide a high drain impedance for the FETs $M_C$ and $M_D$, respectively. In some applications, the drain impedance for the FETs $M_C$ and $M_D$ may be in the range of about 0.5 nH to about 2 nH. In many applications, the load inductors will operate at high enough frequencies that they can be fabricated as an IC component rather than be off-chip. A load inductor may also be settable or adjustable using such technologies as fusible links or laser trimming. A load inductor may also be digitally programmable, such as is taught in U.S. Pat. No. 9,197,194, issued on Nov. 24, 2015, entitled "Method and Apparatus for Use in Tuning Reactance in an Integrated Circuit Device", assigned to the assignee of the present invention and hereby incorporated by reference.

When the Coupled signal reaches the gate of the FET $M_C$, that signal is modulated by the FET $M_C$. The high drain impedance (due to load inductor $L_C$) of the FET $M_C$ causes the Coupled signal to reflect back directly to the OUT port. Similarly, when the Direct signal reaches the gate of the FET $M_D$, that signal is modulated by the FET $M_D$. The high drain impedance (due to load inductor $L_D$) of the FET $M_D$ causes the Direct signal to reflect back to the OUT port via coupling within the reflective hybrid coupler 700. The combined reflected signals ($RF_{OUT}$ in this example) from the OUT port then flow to the input of the amplifier 704.

Of note, because the FETs $M_C$, $M_D$ are non-linear devices, the signals reflected back to the OUT port of the reflective hybrid coupler 700 will have an altered AM-PM profile generated by the non-linear FETs. The round trip of the input signal ($RF_{IN}$ in this example) through the reflective hybrid coupler 700 essentially reverses the AM-PM profile of the input signal compared to the AM-PM profile that would be imposed by the amplifier 704. Accordingly, when the altered AM-PM profile of the input signal is applied to the amplifier 704, the amplifier 704 will generate a modified output signal ($RF_{OUT}'$ in this example) in which the altered AM-PM profile from the non-linear termination circuit 702 substantially compensates for the AM-PM profile imposed by the amplifier 704, resulting in a flatter AM-PM profile for the final output signal. The AM-PM compensation from the non-linear termination circuit 702 consequently improves the EVM metric and allows operation of the amplifier 704 closer to its P1 dB point, where higher efficiency is achieved.

It should be noted that other non-linear termination circuits 702 may be used in place of the specific circuit illustrated in FIG. 7B. For example, either or both of the single FET's $M_C$, $M_D$, may be replaced by a stack of series-coupled FETs in order to withstand higher voltages $V_{DS}$. The FET's $M_C$, $M_D$ may be biased in a variety of known ways, and an impedance matching network may be placed before or after one or both of the capacitors $C_C$ and $C_D$. The FET $M_C$ may differ (e.g., with respect to size) from the FET $M_D$. The bias and/or matching network of the FET $M_C$ may differ from the bias or matching network of the FET $M_D$. In some embodiments, the FETs $M_C$ and $M_D$ may be configured as a common-gate FET amplifier structure in which the input voltage modulates $V_{GS}$ and thus $C_{GS}$.

Figure 8A:
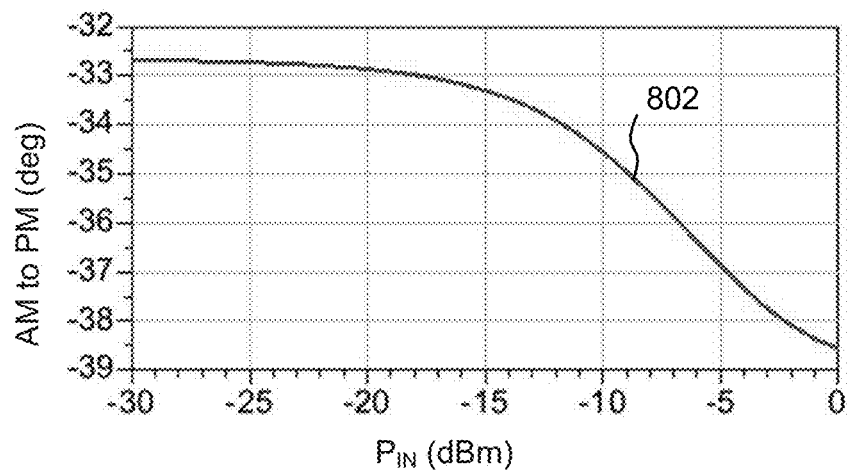
FIG. 8A is a graph of AM to PM variation versus input power $P_{IN}$ for a modeled embodiment of the reflective hybrid coupler and non-linear termination circuit, illustrating a negative-slope altered AM-PM profile intended to compensate for the positive-slope profile generated by the amplifier.

FIG. 8A is a graph of AM to PM variation versus input power $P_{IN}$ for a modeled embodiment of the reflective hybrid coupler 700 and non-linear termination circuit 702, illustrating a negative-slope altered AM-PM profile 802 (i.e., a pre-distortion curve) intended to compensate for the positive-slope profile generated by the amplifier 704. Note the shape of the altered AM-PM profile 802 may be adjusted to suit a particular application by adjusting $V_{GS}$, $V_{DS}$, and/or the load inductors $L_C$, $L_D$ in the circuit shown in FIG. 7B, and/or by re-sizing the FETs $M_C$ and/or $M_D$ and retuning $V_{GS}$.

Figure 8B:
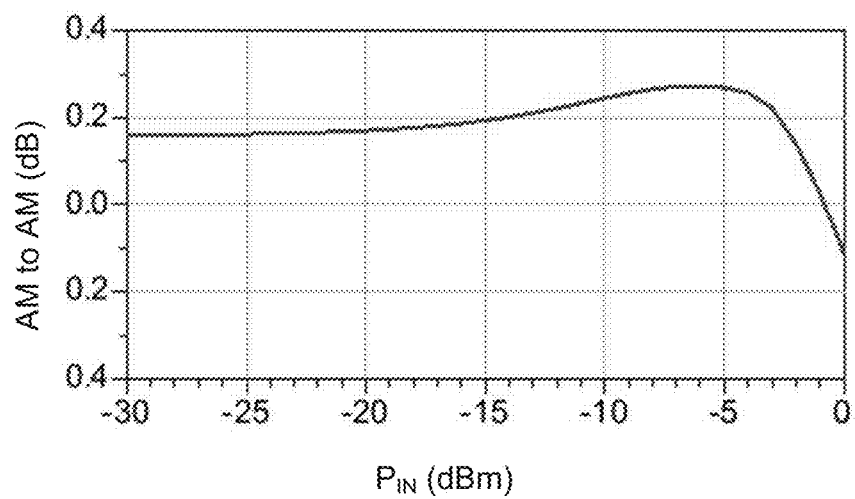
FIG. 8B is a graph of AM to AM variation versus input power $P_{IN}$ for a modeled embodiment of the reflective hybrid coupler and non-linear termination circuit, showing that the combined circuit exhibits no loss, but rather a small gain.

FIG. 8B is a graph of AM to AM variation versus input power $P_{IN}$ for a modeled embodiment of the reflective hybrid coupler 700 and non-linear termination circuit 702, showing that the combined circuit exhibits no loss, but rather a small gain. The gain is because the FETs $M_C$, $M_D$ also behave as amplifiers. In one modeled embodiment, the gain was about 0.2 dB. A benefit of the invention is that, since the AM-AM profile is also slightly pre-distorted, that improvement can be utilized to further extend the 1 dB compression point (P1 dB) of the amplifier 704.

Figure 9A:
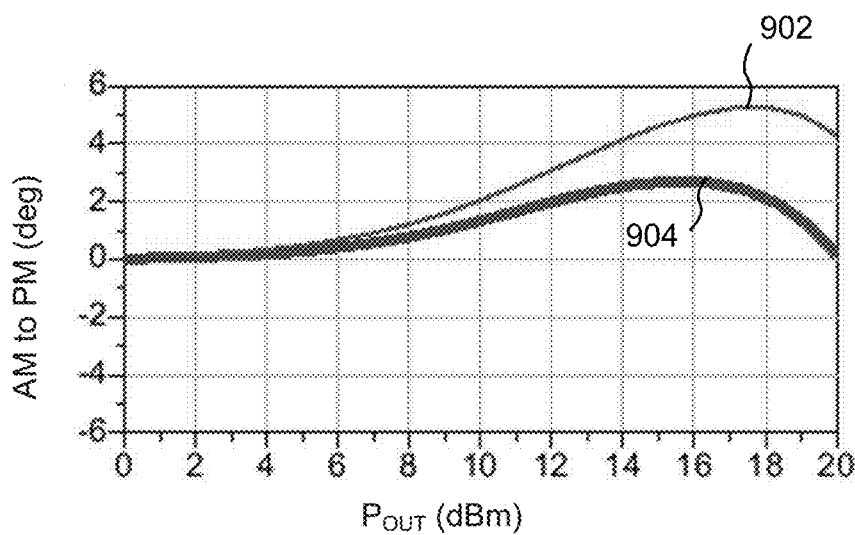
FIG. 9A is a graph of AM to PM variation versus input power $P_{IN}$ for a modeled embodiment of the amplifier alone and of the reflective hybrid coupler and non-linear termination circuit and coupled amplifier operating together.

FIG. 9A is a graph of AM to PM variation versus output power $P_{OUT}$ for a modeled embodiment of the amplifier 704 alone (graph line 902) and of the reflective hybrid coupler 700 and non-linear termination circuit 702 and coupled amplifier 704 operating together (graph line 904). As the graph indicates, the AM-PM metric is flatter—and thus better—when the reflective hybrid coupler 700 and non-linear termination circuit 702 are in place and operational. Consequently, the EVM metric will be improved and thus allow operation of the amplifier 704 closer to its P1 dB point, thereby achieving higher efficiency for the amplifier 704.

Figure 9B:
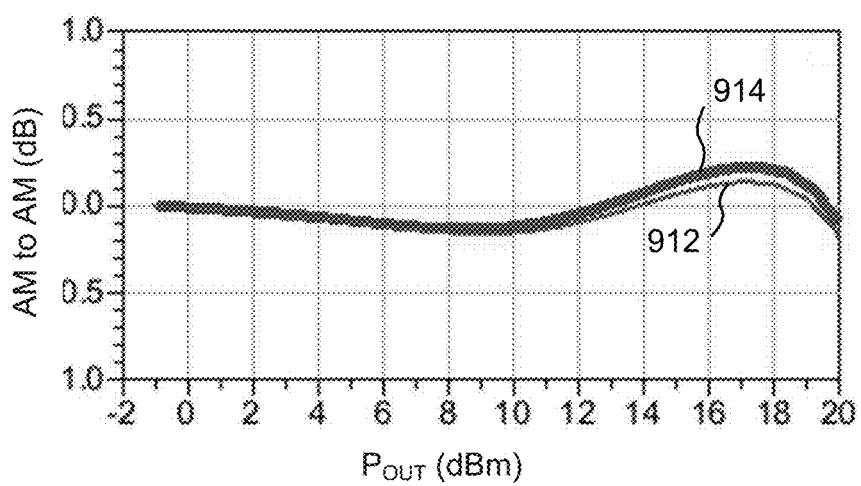
FIG. 9B is a graph of AM to AM variation versus input power $P_{IN}$ for a modeled embodiment of the amplifier alone and of the reflective hybrid coupler and non-linear termination circuit and coupled amplifier operating together.

FIG. 9B is a graph of AM to AM variation versus output power $P_{OUT}$ for a modeled embodiment of the amplifier 704 alone (graph line 912) and of the reflective hybrid coupler 700 and non-linear termination circuit 702 and coupled amplifier 704 operating together (graph line 914). As the graph indicates, the improvement in the modified AM-PM profile of the final output signal from the amplifier 704 is achieved with almost no undesirable effect on the AM-AM profile.

More generally, embodiments of the invention include a reflective hybrid coupler configured to receive an input signal to be linearized, the input signal having a first non-linear distortion profile (e.g., an AM-PM and/or AM-AM profile), and a non-linear termination circuit coupled to the reflective hybrid coupler and configured to reflect a modified input signal back through the reflective hybrid coupler as an output signal, the output signal having a second non-linear distortion profile. The second non-linear distortion profile may be shaped to compensate for a third non-linear distortion profile imposed on the output signal by another device, such as an amplifier.

Alternative Embodiments

It should be appreciated that the linearizer circuit of FIG. 7 may be used in conjunction with amplifiers utilizing an equalization circuit 102, 602 of the types described above. Thus, for example, a linearizer circuit using a reflective hybrid coupler 700 and a non-linear termination circuit 706 may be used to alter the AM-PM profile of an input signal so as to compensate for (essentially reverse) the AM-PM profile imposed by a coupled amplifier that utilizes an equalization circuit 102, 602, which may be (by way of example only) a differential amplifier 100, 200, 300, a multi-stage balanced differential amplifier circuit 400, a multi-stage differential amplifier circuit 500, or a single-ended amplifier circuit 600 (single stage or multi-stage).

System Aspects

Embodiments of the present invention are useful in a wide variety of larger circuits and systems for performing a range of functions, including (but not limited to) RF power amplifiers and RF LNAs. Such functions are useful in a variety of applications, such as radio systems (including cellular radio systems), radar systems (including phased array and automotive radar systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, and WiFi (e.g., 802.11a, b, g, ac, ax), as well as other radio communication standards and protocols.

Figure 10:
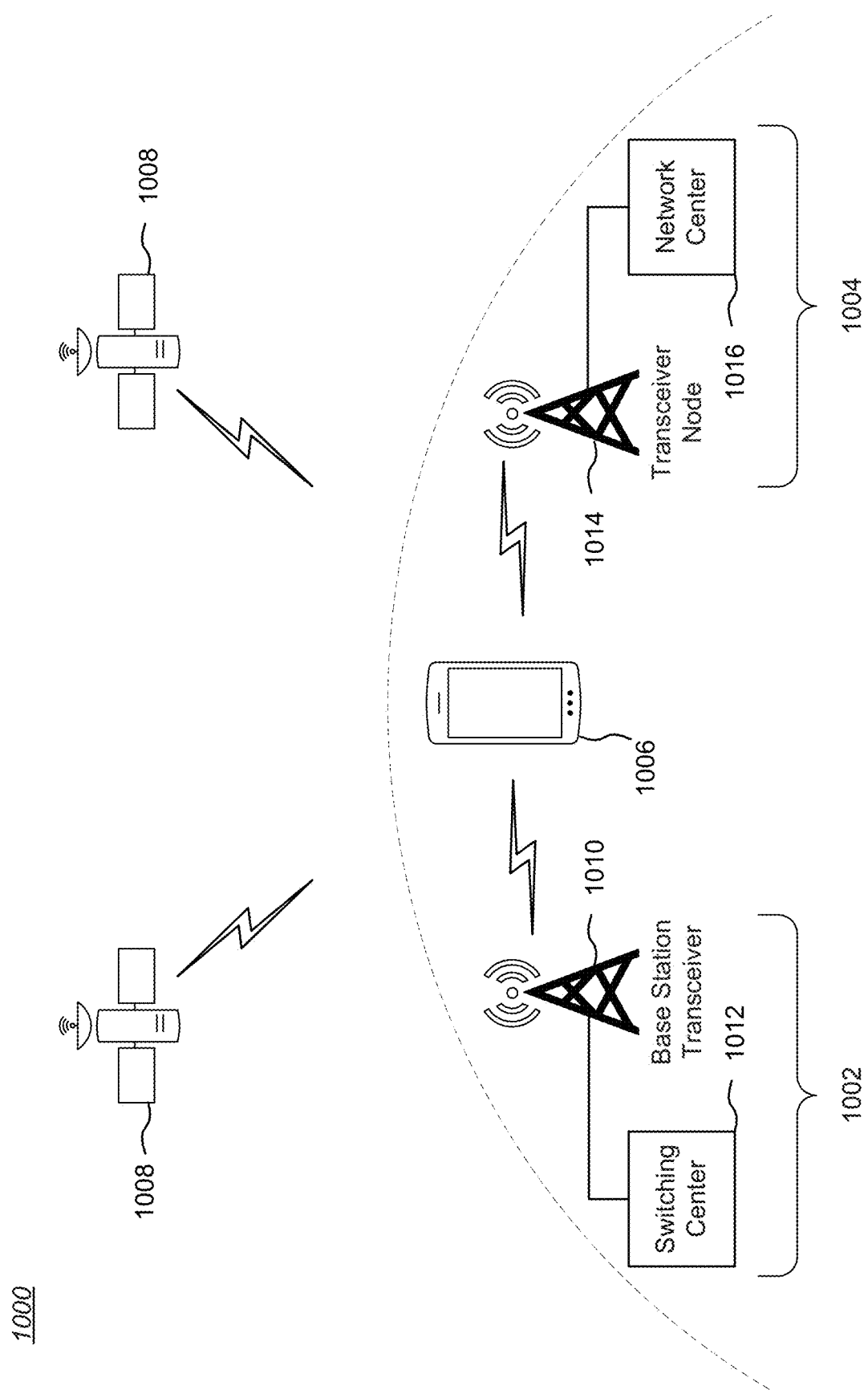
FIG. 10 illustrates an exemplary prior art wireless communication environment comprising different wireless communication systems, and may include one or more mobile wireless devices.

As an example of wireless RF system usage, FIG. 10 illustrates an exemplary prior art wireless communication environment 1000 comprising different wireless communication systems 1002 and 1004, and may include one or more mobile wireless devices 1006.

A wireless device 1006 may be capable of communicating with multiple wireless communication systems 1002, 1004 using one or more of the telecommunication protocols noted above. A wireless device 1006 also may be capable of communicating with one or more satellites 1008, such as navigation satellites (e.g., GPS) and/or telecommunication satellites. The wireless device 1006 may be equipped with multiple antennas, externally and/or internally, for operation on different frequencies and/or to provide diversity against deleterious path effects such as fading and multi-path interference. A wireless device 1006 may be a cellular phone, a personal digital assistant (PDA), a wireless-enabled computer or tablet, or some other wireless communication unit or device. A wireless device 1006 may also be referred to as a mobile station, user equipment, an access terminal, or some other terminology.

The wireless system 1002 may be, for example, a CDMA-based system that includes one or more base station transceivers (BSTs) 1010 and at least one switching center (SC) 1012. Each BST 1010 provides over-the-air RF communication for wireless devices 1006 within its coverage area. The SC 1012 couples to one or more BSTs in the wireless system 1002 and provides coordination and control for those BSTs.

The wireless system 1004 may be, for example, a TDMA-based system that includes one or more transceiver nodes 1014 and a network center (NC) 1016. Each transceiver node 1014 provides over-the-air RF communication for wireless devices 1006 within its coverage area. The NC 1016 couples to one or more transceiver nodes 1014 in the wireless system 1004 and provides coordination and control for those transceiver nodes 1014.

In general, each BST 1010 and transceiver node 1014 is a fixed station that provides communication coverage for wireless devices 1006, and may also be referred to as base stations or some other terminology. The SC 1012 and the NC 1016 are network entities that provide coordination and control for the base stations and may also be referred to by other terminologies.

Figure 11:
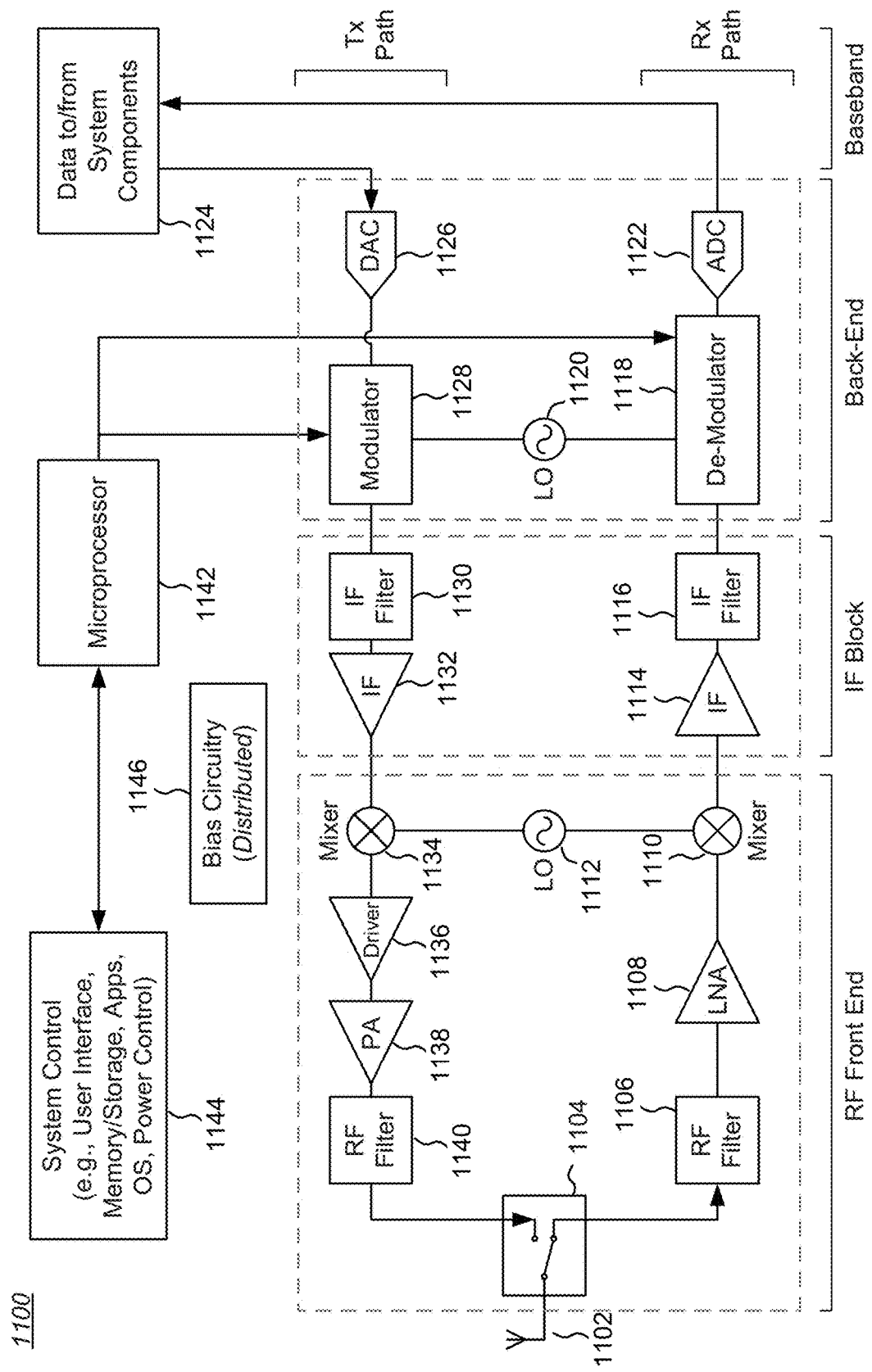
FIG. 11 is a block diagram of a transceiver that might be used in a wireless device, such as a cellular telephone, and which may beneficially incorporate an embodiment of the present invention for improved performance and power efficiency.

An important aspect of any wireless system, including the systems shown in FIG. 10, is in the details of how the component elements of the system perform. FIG. 11 is a block diagram of a transceiver 1100 that might be used in a wireless device, such as a cellular telephone, and which may beneficially incorporate an embodiment of the present invention for improved performance and power efficiency. As illustrated, the transceiver 1100 includes a mix of RF analog circuitry for directly conveying and/or transforming signals on an RF signal path, non-RF analog circuitry for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 1102 and a switching unit 1104, which may be implemented with active switching devices (e.g., field effect transistors or FETs), or with passive devices that implement frequency-domain multiplexing, such as a diplexer or duplexer. An RF filter 1106 passes desired received RF signals to an LNA 1108, the output of which is combined in a mixer 1110 with the output of a first local oscillator 1112 to produce an intermediate frequency (IF) signal. The power, linearity, EVM, PAE, AM-AM, and AM-PM metrics of the LNA 1108 may benefit from the improvement brought about by use of one or more aspects of the present invention. The IF signal may be amplified by an IF amplifier 1114 and subjected to an IF filter 1116 before being applied to a demodulator 1118, which may be coupled to a second local oscillator 1120. The power, linearity, EVM, PAE, AM-AM, and AM-PM metrics of the IF amplifier 1114 may benefit from the improvement brought about by use of one or more aspects of the present invention. The demodulated output of the demodulator 1118 is transformed to a digital signal by an analog-to-digital converter 1122 and provided to one or more system components 1124 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 1124 is transformed to an analog signal by a digital-to-analog converter 1126, the output of which is applied to a modulator 1128, which also may be coupled to the second local oscillator 1120. The modulated output of the modulator 1128 may be subjected to an IF filter 1130 before being amplified by an IF amplifier 1132. The power, linearity, EVM, PAE, AM-AM, and AM-PM metrics of the IF amplifier 1132 may benefit from the improvement brought about by use of one or more aspects of the present invention. The output of the IF amplifier 1132 is then combined in a mixer 1134 with the output of the first local oscillator 1112 to produce an RF signal. The RF signal may be amplified by a driver 1136, the output of which is applied to a power amplifier (PA) 1138. The power, linearity, EVM, PAE, AM-AM, and AM-PM metrics of the PA 1138 may benefit from the improvement brought about by use of one or more aspects of the present invention. The amplified RF signal may be coupled to an RF filter 1140, the output of which is coupled to the antenna 1102 through the switching unit 1104.

The operation of the transceiver 1100 is controlled by a microprocessor 1142 in known fashion, which interacts with system control components (e.g., user interfaces, memory/storage devices, application programs, operating system software, power control, etc.). In addition, the transceiver 1100 will generally include other circuitry, such as bias circuitry 1146 (which may be distributed throughout the transceiver 1100 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 1100 may be in a positioned in a different order (e.g., filters) or omitted. Other components can be (and usually are) added (e.g., additional filters, impedance matching networks, variable phase shifters/attenuators, power dividers, etc.).

As discussed above, the current invention achieves good power, PAE, linearity, and EVM performance in an amplifier. As a person of ordinary skill in the art will understand, a system like the general type shown in FIG. 11 is beneficially impacted by the current invention in critical ways, including better range, better reception, lower power, and longer battery life. These system-level improvements are specifically enabled by the current invention since a number of RF standards require high linearity and low power consumption while increasing power output efficiently. In order to comply with system standards or customer requirements, the current invention is therefore critical to systems like the general type shown in FIG. 11. The current invention therefore specifically defines a system-level embodiment that is creatively enabled by its inclusion in systems like the general type shown in FIG. 11.

Methods of Equalizing

Another aspect of the invention includes methods for equalizing the output of an amplifier. For example, FIG. 12 is a process flow chart 1200 showing one method of equalizing an output from a differential amplifier. The method includes: coupling an equalization circuit coupled to the respective gates and drains of first and second field-effect transistor (FETs) configured as a differential amplifier, the first and second FETs each including a gate configured to receive a respective input signal, a drain providing a respective amplified output signal, and a source coupled to circuit ground (BLOCK 1202); and altering a bias voltage to the gates of the respective first and second FETs in proportion to a power level present at the respective drains of the second and first FETs, as determined by the equalization circuit (BLOCK 1204).

Additional aspects of the method of FIG. 12 may include one or more of the following elements and/or characteristics: wherein the equalization circuit alters the bias voltage to the gate of the first main FET in proportion to the power level present at the drain of the second main FET, and alters the bias voltage to the gate of the second main FET in proportion to the power level present at the drain of the first main FET; wherein the equalization circuit includes at least two cross-coupled common-gate transistors; wherein the equalization circuit includes a first equalization transistor including a drain coupled to the drain of the first main FET, a source coupled to the gate of the second main FET, and a gate configured to be coupled to a first bias voltage source, and a second equalization transistor including a drain coupled to the drain of the second main FET, a source coupled to the gate of the first main FET, and a gate configured to be coupled to a first bias voltage source; wherein the first equalization transistor alters the bias voltage to the gate of the second FET in proportion to the power level present at the drain of the first FET, and the second equalization transistor alters the bias voltage to the gate of the first FET in proportion to the power level present at the drain of the second FET; wherein the drain of the first equalization transistor is coupled to the drain of the first main FET through at least one intervening FET series-coupled to the drain of the first main FET, and wherein the drain of the second equalization transistor is coupled to the drain of the second main FET through at least one intervening FET series-coupled to the drain of the second main FET; wherein the first and second bias voltage sources provide an adjustable level of bias to the respective first and second equalization transistors; wherein the first and second equalization transistors are sized to be less than or equal to about one-sixth the size of the first and second main FETs; wherein the equalization circuit includes a first equalization subcircuit including a stack of n series-coupled transistors coupled to the drain of the first main FET through n−1 intervening FETs series-coupled to the drain of the first main FET, and coupled to the gate of the second main FET, and a second equalization subcircuit including a stack of n series-coupled transistors coupled to the drain of the second main FET through n−1 intervening FETs series-coupled to the drain of the second main FET, and coupled to the gate of the first main FET, wherein $n \geq 1$; further including coupling a first stack of one or more FETs series-coupled to the drain of the first main FET, and coupling a second stack of one or more FETs series-coupled to the drain of the second main FETs; and/or further including deriving the respective input signals to the differential amplifier from the output signal of a linearizer circuit, the linearizer circuit including a reflective hybrid coupler configured to receive an initial input signal to be linearized, the initial input signal having a first amplitude-to-phase modulation (AM-PM) profile, and a non-linear termination circuit coupled to the reflective hybrid coupler and configured to reflect a modified input signal back through the reflective hybrid coupler as an output signal, wherein the output signal has a second AM-PM profile shaped to compensate for a third AM-PM profile imposed on the output signal by the differential amplifier.

As another example, FIG. 13 is a process flow chart showing one method of equalizing an output from a single-ended amplifier. The method includes: coupling an equalization circuit coupled to the gate and drain of a main field-effect transistor (FET) configured as an amplifier, the main FET including a gate configured to receive an input signal, a drain providing a amplified output signal, and a source coupled to circuit ground (BLOCK 1302); and altering a bias voltage to the gate of the main FET in proportion to a power level present at the drain of the main FET, as determined by the equalization circuit (BLOCK 1304).

Additional aspects of the method of FIG. 13 may include one or more of the following elements and/or characteristics: wherein the equalization circuit includes a transistor including a drain coupled to the drain of the main FET, a source coupled to the gate of the main FET, and a gate configured to be coupled to a bias voltage source, the equalization transistor configured to alter the bias voltage to the gate of the main FET; wherein the equalization transistor is coupled to the drain of the main FET through at least one intervening FET series-coupled to the drain of the main FET; wherein the bias voltage source provides an adjustable level of bias to the equalization transistor; wherein the equalization transistor is sized to be less than or equal to about one-sixth the size of the main FET; wherein the equalization circuit includes a stack of n series-coupled transistors coupled to the drain of the main FET and the gate of the main FET, wherein $n \geq 1$; wherein the equalization circuit includes a stack of n series-coupled transistors coupled between the drain of the main FET through n−1 intervening FETs series-coupled to the drain of the main FET, and the gate of the main FET; further including coupling a stack of one or more FETs series-coupled to the drain of the main FET; and/or further including deriving the input signal to the amplifier from the output signal of a linearizer circuit, the linearizer circuit including a reflective hybrid coupler configured to receive an initial input signal to be linearized, the initial input signal having a first amplitude-to-phase modulation (AM-PM) profile, and a non-linear termination circuit coupled to the reflective hybrid coupler and configured to reflect a modified input signal back through the reflective hybrid coupler as an output signal, wherein the output signal has a second AM-PM profile shaped to compensate for a third AM-PM profile imposed on the output signal by the amplifier.

Methods of Linearizing

Figure 14:
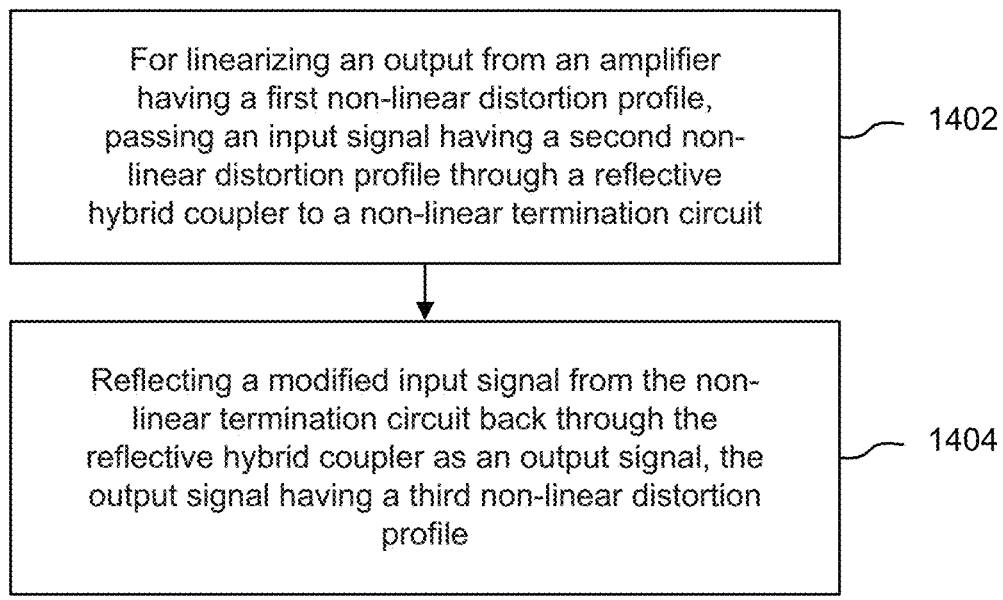
FIG. 14 is a process flow chart showing one method of linearizing an output from an amplifier having a first amplitude-to-phase modulation (AM-PM) profile.

Another aspect of the invention includes methods for linearizing an output from an amplifier. For example, FIG. 14 is a process flow chart 1400 showing one method of linearizing an output from an amplifier having a first non-linear distortion profile (such as an AM-PM profile). The method includes: passing an input signal having a second non-linear distortion profile through a reflective hybrid coupler to a non-linear termination circuit (Block 1402); and reflecting a modified input signal from the non-linear termination circuit back through the reflective hybrid coupler as an output signal, the output signal having a third non-linear distortion profile (Block 1404).

Additional aspects of the above method may include one or more of the following: wherein the non-linear termination circuit includes a first reflective modulation device coupled to a direct port of the reflective hybrid coupler, and a second reflective modulation device coupled to a coupled port of the reflective hybrid coupler; wherein the first and second reflective modulation devices include respective first and second field-effect transistors (FETs) each having a gate, a drain, and a source, wherein the gate of the FET of the first reflective modulation device is coupled to the direct port of the reflective hybrid coupler, and the gate of the FET of the second reflective modulation device is coupled to the coupled port of the reflective hybrid coupler; wherein the gate of the FET of the first reflective modulation device is capacitively coupled to the direct port of the reflective hybrid coupler, and the gate of the FET of the second reflective modulation device is capacitively coupled to the coupled port of the reflective hybrid coupler; wherein the drain of the FET of the first reflective modulation device is coupled to a voltage through a first load inductor, and the drain of the FET of the second reflective modulation device is coupled to a voltage through a second load inductor; wherein the drains of the FETs of the first and second reflective modulation devices are coupled to a voltage through a common load inductor; wherein the gates of the FETs of the first and second reflective modulation devices are coupled to respective bias voltages; and/or wherein the third non-linear distortion profile is shaped to compensate for the first non-linear distortion profile.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form an end product such as a cellular telephone, laptop computer, or electronic tablet, or to form a higher level module which may be used in a wide variety of products, such as vehicles, test equipment, medical devices, etc. Through various configurations of modules and assemblies, such ICs typically enable a mode of communication, often wireless communication.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A differential amplifier, including:
   (a) a first main field-effect transistor (FET) including a gate configured to receive a first input signal, a drain providing a first amplified output signal, and a source coupled to circuit ground;
   (b) a second main FET including a gate configured to receive a second input signal, a drain providing a second amplified output signal, and a source coupled to circuit ground; and
   (c) an equalization circuit coupled to the respective gates and drains of the first and second main FETs and configured to generate an equalization voltage that alters a bias voltage to the gates of the respective first and second main FETs in proportion to a power level present at the respective drains of the second and first main FETs, wherein the equalization circuit includes:
   (1) a first equalization subcircuit including a stack of n series-coupled transistors, wherein n≥1, the stack of n series-coupled transistors of the first equalization subcircuit having a first transistor having a source coupled to the gate of the first main FET and a last transistor having a drain coupled to the drain of the second main FET; and
   (2) a second equalization subcircuit including a stack of n series-coupled transistors, wherein n≥1, the stack of n series-coupled transistors of the second equalization subcircuit having a first transistor having a source coupled to the gate of the second main FET and a last transistor having a drain coupled to the drain of the first main FET.

2. The invention of claim 1, wherein the equalization circuit alters the bias voltage to the gate of the first main FET in proportion to the power level present at the drain of the second main FET, and alters the bias voltage to the gate of the second main FET in proportion to the power level present at the drain of the first main FET.

3. The invention of claim 1, wherein the equalization circuit includes at least two cross-coupled common-gate transistors.

4. The invention of claim 1, wherein:
   (a) at least one transistor in the first equalization subcircuit includes a gate configured to be coupled to a first bias voltage source; and
   (b) at least one transistor in the second equalization subcircuit includes a gate configured to be coupled to a second bias voltage source.

5. The invention of claim 1, wherein, the first equalization subcircuit alters the bias voltage to the gate of the second main FET in proportion to the power level present at the drain of the first main FET, and the second equalization subcircuit alters the bias voltage to the gate of the first main FET in proportion to the power level present at the drain of the second main FET.

6. The invention of claim 4, wherein the first and second bias voltage sources provide an adjustable level of bias voltage.

7. The invention of claim 1, wherein the stack of n series-coupled transistors of the first equalization subcircuit and the stack of n series-coupled transistors of the second equalization subcircuit are sized to be less than or equal to about one-sixth the size of the first and second main FETs.

8. The invention of claim 1, further including a first stack of one or more FETs series-coupled to the drain of the first main FET, and a second stack of one or more FETs series-coupled to the drain of the second main FET.

9. The invention of claim 1, further including a linearizer circuit, the linearizer circuit including:
   (a) a reflective hybrid coupler configured to receive an input signal to be linearized, the input signal having a first amplitude-to-phase modulation (AM-PM) profile; and
   (b) a non-linear termination circuit coupled to the reflective hybrid coupler and configured to reflect a modified input signal back through the reflective hybrid coupler as an output signal;
   wherein the first input signal and the second input signal to the differential amplifier are derived from the output signal of the linearizer circuit, and the output signal has a second AM-PM profile shaped to compensate for a third AM-PM profile imposed on the output signal by the differential amplifier.

10. An amplifier, including:
    (a) a main field-effect transistor (FET) including a gate configured to receive an input signal, a drain providing an amplified output signal, and a source coupled to circuit ground; and
    (b) an equalization circuit coupled to the gate and directly connected to the drain of the main FET and configured to generate an equalization voltage that alters a bias voltage to the gate of the main FET in proportion to a power level present at the drain of the main FET, wherein the equalization circuit includes a stack of n series-coupled equalization transistors, wherein n≥1, the stack of n series-coupled equalization transistors having (1) a first equalization transistor having a source coupled to the gate of the main FET and having a gate, and (2) a last equalization transistor having a drain directly connected to the drain of the main FET;
    (c) a resistor coupled to the gate of the first equalization transistor and configured to be coupled to a bias voltage source; and
    (d) a shunt capacitor coupled between the gate of the first equalization transistor and a reference voltage.

11. The invention of claim 10, wherein the bias voltage source provides an adjustable level of bias to at least the first equalization transistor.

12. The invention of claim 10, wherein the stack of n series-coupled equalization transistors is sized to be less than or equal to about one-sixth the size of the main FET.

13. The invention of claim 10, further including a stack of one or more FETs series-coupled to the drain of the main FET.

14. An amplifier, including:
    (a) a main field-effect transistor (FET) including a gate configured to receive an input signal, a drain providing an amplified output signal, and a source coupled to circuit ground; and
    (b) an equalization circuit coupled to the gate and directly connected to the drain of the main FET and configured to generate an equalization voltage that alters a bias voltage to the gate of the main FET in proportion to a power level present at the drain of the main FET, wherein the equalization circuit includes a stack of n series-coupled equalization transistors, wherein n≥1, the stack of n series-coupled equalization transistors having (1) a first equalization transistor having a source coupled to the gate of the main FET and having a gate, and (2) a last equalization transistor having a drain directly coupled to the drain of the main FET;

(c) a resistor coupled to the gate of the first equalization transistor and configured to be coupled to a bias voltage source; and (d) a shunt capacitor coupled between the gate of the first equalization transistor and a reference voltage; and (e) a linearizer circuit, the linearizer circuit including:
  (1) a reflective hybrid coupler configured to receive an initial input signal to be linearized, the initial input signal having a first amplitude-to-phase modulation (AM-PM) profile; and
  (2) a non-linear termination circuit coupled to the reflective hybrid coupler and configured to reflect a modified input signal back through the reflective hybrid coupler as an output signal;

wherein the input signal to the amplifier is derived from the output signal of the linearizer circuit, and the output signal has a second AM-PM profile shaped to compensate for a third AM-PM profile imposed on the output signal by the amplifier.

15. The invention of claim 1, further including a differential capacitor coupled between a first gate of the first transistor in the stack of n series-coupled transistors of the first equalization subcircuit and a second gate of the first transistor in the stack of n series-coupled transistors of the second equalization subcircuit.

16. The invention of claim 15, further including a first resistor coupled between the first gate of the first transistor in the stack of n series-coupled transistors of the first equalization subcircuit and an equalization circuit bias voltage source.

17. The invention of claim 16, further including a second resistor coupled between the second gate of the first transistor in the stack of n series-coupled transistors of the second equalization subcircuit and the equalization circuit bias voltage source.

18. The invention of claim 1, further including a first capacitor coupled between a first gate of the first transistor in the stack of n series-coupled transistors of the first equalization subcircuit and a reference voltage.

19. The invention of claim 18, further including a second capacitor coupled between a second gate of the first transistor in the stack of n series-coupled transistors of the second equalization subcircuit and the reference voltage.

20. The invention of claim 19, wherein the reference voltage comprises a ground voltage.

* * * * *